(12) United States Patent
Kimura et al.

(10) Patent No.: US 7,362,087 B2
(45) Date of Patent: Apr. 22, 2008

(54) ADAPTER FOR CIRCUIT BOARD EXAMINATION AND DEVICE FOR CIRCUIT BOARD EXAMINATION

(75) Inventors: Kiyoshi Kimura, Hidaka (JP); Sugiro Shimoda, Hidaka (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/588,760

(22) PCT Filed: Feb. 17, 2005

(86) PCT No.: PCT/JP2005/002441

§ 371 (c)(1),
(2), (4) Date: Aug. 8, 2006

(87) PCT Pub. No.: WO2005/080996

PCT Pub. Date: Sep. 1, 2005

(65) Prior Publication Data

US 2007/0159200 A1     Jul. 12, 2007

(30) Foreign Application Priority Data

Feb. 24, 2004   (JP) .............................. 2004-048158

(51) Int. Cl.
*G01R 31/02*     (2006.01)
*H01R 11/01*     (2006.01)
*H01R 4/58*      (2006.01)

(52) U.S. Cl. ..................... 324/158.1; 324/754; 439/91; 439/66

(58) Field of Classification Search ..................... None
See application file for complete search history.

(56) References Cited

U.S. PATENT DOCUMENTS

| 4,740,657 | A  | * | 4/1988 | Tsukagoshi et al. ....... 174/88 R |
|---|---|---|---|---|
| 5,109,596 | A  | * | 5/1992 | Driller et al. ................. 29/705 |
| 5,317,255 | A  | * | 5/1994 | Suyama et al. ............. 324/754 |
| 5,818,700 | A  | * | 10/1998 | Purinton ..................... 361/760 |
| 6,447,308 | B1 | * | 9/2002 | McCarthy et al. ............. 439/91 |
| 7,059,874 | B2 | * | 6/2006 | Weiss .......................... 439/91 |

FOREIGN PATENT DOCUMENTS

| JP | 11 111064    | 4/1999 |
|----|--------------|--------|
| JP | 2000 294043  | 10/2000 |
| JP | 2003 77560   | 3/2003 |

* cited by examiner

*Primary Examiner*—Paresh Patel
(74) *Attorney, Agent, or Firm*—Oblon, Spivak, McClelland, Maier & Neustadt, P.C.

(57) ABSTRACT

An adaptor for inspection of circuit boards includes a wiring board for connection, on a front surface of which a plurality of connecting electrodes are formed correspondingly to electrodes to be inspected, and an anisotropically conductive elastomer sheet detachably arranged on the front surface of the wiring board for connection. The anisotropically conductive elastomer sheet has a surface roughness of 0.5 to 5 μm on its front surface coming into contact with the circuit board, and a surface roughness of at most 0.3 μm on its back surface coming into contact with the wiring board for connection. The wiring board for connection has, on its front surface, an insulating layer formed such that each of the connecting electrodes is exposed, and the insulating layer has a surface roughness of at most 0.2 μm on its front surface.

12 Claims, 10 Drawing Sheets

ADAPTER FOR CIRCUIT BOARD EXAMINATION AND DEVICE FOR CIRCUIT BOARD EXAMINATION

TECHNICAL FIELD

The present invention relates to an adaptor for inspection of circuit boards, which is used in electrical inspection of circuit boards, for example, printed circuit boards and the like, and an inspection apparatus for circuit boards, which is equipped with this adaptor for inspection of circuit boards.

BACKGROUND ART

With respect to a circuit board for making up or mounting electronic parts, such as packaged LSIs such as BGA and CSP, MCM, and other integrated circuit devices, it is necessary to inspect the electrical properties of the circuit board before the electronic parts or the like are assembled or mounted for the purpose of confirming that a wiring pattern of the circuit board has the expected performance.

As an inspection apparatus for inspecting the electrical properties of a circuit board, there has heretofore been known that comprising an inspection electrode device, in which a great number of inspection electrodes are arranged, and an adaptor for electrically connecting the inspection electrodes in this inspection electrode device to electrodes to be inspected of a circuit board that is an object of inspection. As the adaptor of such an inspection apparatus, there has been known that having a wiring board for connection called a pitch converting board and composed of a printed wiring board and an anisotropically conductive elastomer sheet arranged on the surface of this wiring board for connection.

As the wiring board for connection in this adaptor, are known that having, on a front surface thereof, a plurality of connecting electrodes arranged in accordance with a pattern corresponding to a pattern of electrodes to be inspected of a circuit board, which is an object of inspection, and, on a back surface thereof, a plurality of terminal electrodes arranged in accordance with a pattern corresponding to a pattern of a plurality of inspection electrodes selected from the great number of the inspection electrodes in the inspection electrode device (see, for example, Patent Art. 1), that having, on a front surface thereof, pairs of connecting electrodes each composed of a connecting electrode for current supply and a connecting electrode for voltage measurement and arranged in accordance with a pattern corresponding to electrodes to be inspected of a circuit board, which is an object of inspection, and, on a back surface thereof, a plurality of terminal electrodes arranged in accordance with a pattern corresponding to a pattern of a plurality of inspection electrodes selected from the great number of the inspection electrodes in the inspection electrode device (see, for example, Patent Art. 2), and the like. The adaptor having the former wiring board for connection is used in, for example, an open short-circuit test of each circuit in a circuit board, and the adaptor having the latter wiring board for connection is used in an electric resistance-measuring test of each circuit in a circuit board.

On the other hand, the anisotropically conductive elastomer sheet is a sheet exhibiting conductivity only in its thickness-wise direction or exhibiting conductivity only in the thickness-wise direction when it is pressurized, and those of various structures have heretofore been known. For example, Patent Art. 3 discloses an anisotropically conductive elastomer sheet (hereinafter also referred to as "dispersion type anisotropically conductive elastomer sheet") obtained by uniformly dispersing metal particles in an elastomer, and Patent Art. 4 discloses an anisotropically conductive elastomer sheet (hereinafter also referred to as "uneven distribution type anisotropically conductive elastomer sheet") obtained by unevenly distributing particles of a conductive magnetic substance in an elastomer to form a great number of conductive path-forming parts each extending in a thickness-wise direction thereof and an insulating part mutually insulating them. Further, Patent Art. 5 discloses an uneven distribution type anisotropically conductive elastomer sheet with a difference in level defined between the surface of each conductive path-forming part and an insulating part.

These anisotropically conductive elastomer sheets are obtained by charging a molding material with conductive particles exhibiting magnetism contained in a material for polymeric substance, which will become an elastic polymeric substance by being cured, into a mold, thereby forming a molding material layer having a necessary thickness, applying a magnetic field to the molding material layer in a thickness-wise direction thereof and subjecting the molding material layer to a curing treatment. In such an anisotropically conductive elastomer sheet, the conductive particles are contained in the base material composed of the elastic polymeric substance in a state oriented so as to align in the thickness-wise direction, and a conductive path is formed by a chain of a great number of the conductive particles.

Among such anisotropically conductive elastomer sheets, the dispersion type anisotropically conductive elastomer sheet has the advantage of the following points compared with the uneven distribution type anisotropically conductive elastomer sheet.

(1) The uneven distribution type anisotropically conductive elastomer sheet needs to be produced by using a special and expensive mold, whereas the dispersion type anisotropically conductive elastomer sheet can be produced at low cost without using such a mold.

(2) The uneven distribution type anisotropically conductive elastomer sheet needs to form conductive path-forming parts in accordance with a pattern corresponding to a pattern of electrodes to be inspected and is individually produced according to a circuit board that is an object of inspection, whereas the dispersion type anisotropically conductive elastomer sheet can be used irrespective of the pattern of electrodes to be inspected and thus has general-purpose property.

(3) Since the uneven distribution type anisotropically conductive elastomer sheet exhibits conductivity at its conductive path-forming parts in the thickness-wise direction thereof and does not exhibit conductivity at its insulating part, positioning of the conductive path-forming parts to electrodes to be inspected is required when the uneven distribution type anisotropically conductive elastomer sheet is used, whereas the dispersion type anisotropically conductive elastomer sheet exhibits conductivity over the whole surface thereof in the thickness-wise direction thereof, and so positioning to the electrodes to be inspected is unnecessary, and an electrically connecting operation becomes easy.

On the other hand, in the uneven distribution type anisotropically conductive elastomer sheet, the insulating part mutually insulating adjacent conductive path-forming parts is formed between the adjacent conductive path-forming parts, so that the uneven distribution type anisotropically conductive elastomer sheet has the advantage of having performance that electrical connection to respective electrodes to be inspected can be achieved with high reliability in a state that necessary insulating property has been retained between adjacent electrodes to be inspected even about a circuit board, in which the electrodes to be inspected are arranged at a small pitch, i.e., having high resolving power compared with the dispersion type anisotropically conductive elastomer sheet.

In the dispersion type anisotropically conductive elastomer sheet, however, higher resolving power is achieved as its thickness becomes smaller because conductive paths formed in the thickness-wise direction become short. Accordingly, that having a small thickness is used as the dispersion type anisotropically conductive elastomer sheet in the adaptor when a circuit board, in which a pitch between electrodes to be inspected is small, is inspected.

In an inspection apparatus for circuit board, which is equipped with such an adaptor as described above, a circuit board (hereinafter also referred to as "circuit board to be inspected"), which is an object of inspection, is conveyed in an inspecting region by, for example, a conveying mechanism of the rail-conveying type having a conveyor belt and a guide rail, the anisotropically conductive elastomer sheet in the adaptor is brought into contact with electrodes (hereinafter also referred to as "electrodes to be inspected") of the circuit board conveyed to the inspecting region, and the anisotropically conductive elastomer sheet is pressurized in the thickness-wise direction thereof, whereby electrical connection of the electrodes to be inspected of the circuit board to be inspected to the inspection electrodes in the inspection electrode device is achieved. In this state, necessary electrical inspection as to the circuit board to be inspected is conducted. After electrical inspection as to one circuit board to be inspected is conducted, the pressurization against the circuit board to be inspected is released, the circuit board to be inspected is conveyed from the inspecting region to a proper place, another circuit board to be inspected is conveyed to the inspecting region, and the same operation as described above is repeated on said another circuit board to be inspected, thereby conducting electrical inspection (see, for example, Patent Art. 6).

However, the adaptor used in such an inspection apparatus for circuit boards involves the following problems.

More specifically, the elastic polymeric substance, for example, silicone rubber, forming the anisotropically conductive elastomer sheet bears adhesive property by pressurization, so that the anisotropically conductive elastomer sheet may adhere to the surface of the circuit board to be inspected in some cases when the pressurization against the circuit board to be inspected is released, and may not be easily separated from the circuit board to be inspected. When such a phenomenon takes place, the circuit board to be inspected, which has completed the inspection, is not surely conveyed from the inspecting region, or the anisotropically conductive elastomer sheet is separated from the wiring board for connection as it adheres to the circuit board to be inspected, and the circuit board to be inspected is conveyed in this state. As a result, the electrical inspection of a subsequent circuit board to be inspected cannot be carried out. As described above, the conventional adaptor involves a problem that it is difficult to smoothly conduct an inspection operation when the electrical inspection is continuously conducted on a great number of circuit boards to be inspected.

As means for solving such a problem, are considered a means that the anisotropically conductive elastomer sheet is fixed to the wiring board for connection by means of a fixing tool, a means that the anisotropically conductive elastomer sheet is fixed to the wiring board for connection with an adhesive, and the like.

However, the former means involves a problem that since the elastic polymeric substance forming the anisotropically conductive elastomer sheet is flexible and low in strength, a portion of the anisotropically conductive elastomer sheet, which has been fixed by the fixing tool, is easy to be broken, and particularly, the portion is early broken when the thickness of the anisotropically conductive elastomer sheet is small. As a result, the service life of the anisotropically conductive elastomer sheet is short.

On the other hand, the latter means involves a problem that it is difficult to replace only the anisotropically conductive elastomer sheet by a new one when the anisotropically conductive elastomer sheet suffers from trouble, and so it is necessary to replace the whole adaptor including the wiring board for connection. As a result, increase in inspection cost for circuit boards is incurred.

Further, as means for inhibiting the adhesion of the anisotropically conductive elastomer sheet to the circuit board to be inspected, have been proposed a means that an adhesion-preventing film is provided on the surface of the anisotropically conductive elastomer sheet (see, for example, Patent Art. 7), a means that the surface of the anisotropically conductive elastomer sheet is subjected to an anti-adhesion treatment such as a corona discharge treatment, glow discharge treatment, plasma treatment, flame treatment, ozone treatment, electromagnetic wave treatment or radiation treatment (see, for example, Patent Art. 8), and a means that the surface of the anisotropically conductive elastomer sheet is roughened (see, for example, Patent Art. 9).

However, these means make it possible to inhibit the adhesion of the anisotropically conductive elastomer sheet to the circuit board to be inspected, but it is difficult to prevent the anisotropically conductive elastomer sheet from separating from the wiring board for connection. After all, it is necessary to fix the anisotropically conductive elastomer sheet to the wiring board for connection by means of the fixing tool or adhesive.

Patent Art. 1: Japanese Patent Application Laid-Open. No. 249924/1994;

Patent Art. 2: Japanese Patent Application Laid-Open No. 2001-235492;

Patent Art. 3: Japanese Patent Application Laid-Open No. 93393/1976;

Patent Art. 4: Japanese Patent Application Laid-Open No. 147772/1978;

Patent Art. 5: Japanese Patent Application Laid-Open No. 250906/1986;

Patent Art. 6: Japanese Patent Application Laid-Open No. 258350/1995;

Patent Art. 7: Japanese Patent Application Laid-Open No. 2001-185260;

Patent Art. 8: Japanese Patent Application Laid-Open No. 2001-185258;

Patent Art. 9: Japanese Patent Application Laid-Open No. 2003-77560.

DISCLOSURE OF THE INVENTION

The present invention has been made on the basis of the foregoing circumstances and has as its first object the provision of an adaptor for inspection of circuit boards, by which an inspection operation can be smoothly carried out even when electrical inspection is continuously conducted on a great number of circuit boards to be inspected, the original service life of an anisotropically conductive elastomer sheet can be attained, and the anisotropically conductive elastomer sheet can be easily replaced by a new one when the anisotropically conductive elastomer sheet suffers from trouble.

A second object of the present invention is to provide an inspection apparatus for circuit boards, which is equipped with the above-described adaptor for inspection of circuit boards.

An adaptor according to the present invention for inspection of circuit boards comprises a wiring board for connection, on the front surface of which a plurality of connecting electrodes are formed in accordance with a pattern corresponding to a pattern of electrodes to be inspected of a circuit board, which is an object of inspection, and an anisotropically conductive elastomer sheet detachably arranged on the front surface of the wiring board for connection, wherein the anisotropically conductive elastomer sheet has a surface roughness of 0.5 to 5 μm on its front surface coming into contact with the circuit board, and a surface roughness of at most 0.3 μm on its back surface coming into contact with the wiring board for connection, and wherein the wiring board for connection has, on its front surface, an insulating layer formed in such a manner that each of the connecting electrodes is exposed, and the insulating layer has a surface roughness of at most 0.2 μm on its front surface.

An adaptor according to the present invention for inspection of circuit boards comprises a wiring board for connection, on the front surface of which plural pairs of connecting electrodes each composed of a connecting electrode for current supply and a connecting electrode for voltage measurement have been formed in accordance with a pattern corresponding to a pattern of electrodes to be inspected of a circuit board, which is an object of inspection, and an anisotropically conductive elastomer sheet detachably arranged on the front surface of the wiring board for connection, wherein the anisotropically conductive elastomer sheet has a surface roughness of 0.5 to 5 μm on its front surface coming into contact with the circuit board, and a surface roughness of at most 0.3 μm on its back surface coming into contact with the wiring board for connection, and wherein the wiring board for connection has, on its front surface, an insulating layer formed in such a manner that each pair of the connecting electrodes are exposed, and the insulating layer has a surface roughness of at most 0.2 μm on its front surface.

In the adaptor according to the present invention for inspection of circuit boards, it may be preferable that the anisotropically conductive elastomer sheet be obtained by containing a great number of conductive particles exhibiting magnetism in an elastic polymeric substance, and the conductive particles be oriented so as to align in a thicknesswise direction of the sheet, thereby forming a plurality of chains of the conductive particles.

In such an adaptor for inspection of circuit boards, the anisotropically conductive elastomer sheet may preferably be such that chains of the conductive particles are formed in a state distributed in a plane direction.

An inspection apparatus for circuit boards according to the present invention comprises the above-described adaptor for inspection of circuit boards.

According to the adaptors of the present invention for inspection of circuit boards, one surface of the anisotropically conductive elastomer sheet, with which the circuit board to be inspected comes into contact, is roughened in such a manner the surface roughness thereof falls within a specific range, whereby a contact area between the circuit board to be inspected and the anisotropically conductive elastomer sheet is small when pressurization against the circuit board to be inspected is released, so that the adhesion property that an elastic polymeric substance forming the anisotropically conductive elastomer sheet has can be suppressed, thereby preventing or inhibiting the anisotropically conductive elastomer sheet from adhering to the circuit board to be inspected.

In addition, the other surface of the anisotropically conductive elastomer sheet, with which the wiring board for connection comes into contact, is formed into a flat surface having a small surface roughness, and the wiring board for connection has, on its front surface, the insulating layer having a small surface roughness, so that a contact area between the wiring board for connection and the anisotropically conductive elastomer sheet is great even when the pressurization against the circuit board to be inspected is released, and the adhesion between both becomes high, whereby the adhesion property that the elastic polymeric substance forming the anisotropically conductive elastomer sheet has can be fully exhibited. As a result, the anisotropically conductive elastomer sheet can be surely held by the wiring board for connection, thereby preventing the anisotropically conductive elastomer sheet from separating from the wiring board for connection.

Accordingly, an inspection operation can be smoothly carried out even when electrical inspection is continuously conducted on a great number of circuit boards to be inspected.

Since the anisotropically conductive elastomer sheet is detachably provided on the wiring board for connection, the anisotropically conductive elastomer sheet can be easily replaced by a new one even when the anisotropically conductive elastomer sheet suffers from trouble.

Further, since there is no need to mechanically fix the anisotropically conductive elastomer sheet to the wiring board for connection by a fixing tool, it can be avoided to damage the anisotropically conductive elastomer sheet by the fixing tool, whereby the original service life of the anisotropically conductive elastomer sheet can be attained.

According to the inspection apparatus for circuit boards of the present invention, the above-described adaptor for inspection of circuit boards is provided, so that an inspection operation can be smoothly carried out even when electrical inspection is continuously conducted on a great number of circuit boards to be inspected, the anisotropically conductive elastomer sheet can be easily replaced by a new one even when the anisotropically conductive elastomer sheet suffers from trouble, and moreover the original service life of the anisotropically conductive elastomer sheet can be attained.

DESCRIPTION OF CHARACTERS

Figure 1:
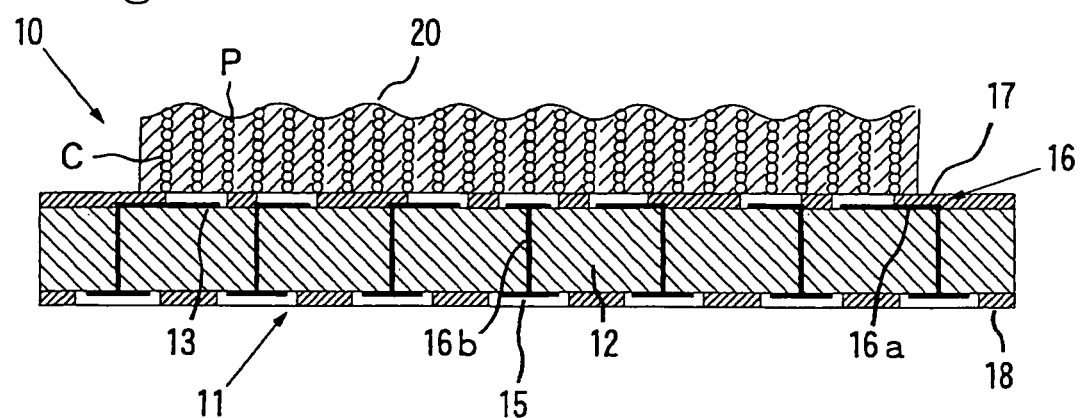
[FIG. 1] is a cross-sectional view illustrating the construction of an adaptor for inspection of circuit boards according to the first embodiment of the present invention.

1 Circuit board to be inspected
2 Electrode to be inspected
3 Electrode to be inspected
10 Adaptor for inspection of circuit boards
11 Wiring board for connection
12 Insulating substrate
13 Connecting electrode
13A Thin metal layer
13B Base layers for connecting electrodes
14 Pair of connecting electrodes
14a Connecting electrode for current supply
14b Connecting electrode for voltage measurement
15 Terminal electrode
15A Thin metal layer
16 Internal wiring
16a Patterned wiring part
16b Via hole
16c Interlayer patterned wiring part
16H Through-hole
17 Insulating layer
18 Insulating layer
19 Protecting seal
20 Anisotropically conductive elastomer sheet
20A Molding material layer
20B Molding material
21 One surface-side molding member
21S Molding surface
22 The other surface-side molding member
23 Spacer
24 Pressure roll
25 Supporting roll
26 Pressure roll device
27, 28 Electromagnet
30 Upper-side jig for inspection
35 Anisotropically conductive elastomer sheet
40 Inspection electrode device
41 Inspection electrode
42 Inspection electrode-supporting plate
45 Upper-side supporting mechanism
46 Base table,
47 Supporting pin
48 Connector
50 Lower-side jig for inspection
55 Anisotropically conductive elastomer sheet
60 Inspection electrode device
61 Inspection electrode
62 Inspection electrode-supporting plate
65 Lower-side supporting mechanism
66 Base table 67 Supporting pin
68 Connector
P Conductive particle
C Chain of conductive particles
D Projected portion in anisotropically conductive elastomer sheet
V Recessed portion in anisotropically conductive elastomer sheet
T Projected portion in one surface-side molding member
H Recessed portion in one surface-side molding member
R inspection-executing region
W Electric wire

BEST MODE FOR CARRYING OUT THE INVENTION

The embodiments of the present invention will hereinafter be described in detail.

FIG. 1 is a cross-sectional view illustrating the construction of an adaptor for inspection of circuit boards according to the first embodiment of the present invention. This adaptor 10 for inspection of circuit boards is used for carrying out, for example, an open short-circuit test on circuit boards to be inspected and has a wiring board 11 for connection and an anisotropically conductive elastomer sheet 20 detachably provided on a front surface (upper surface in FIG. 1) of this wiring board 11 for connection.

Figure 2:
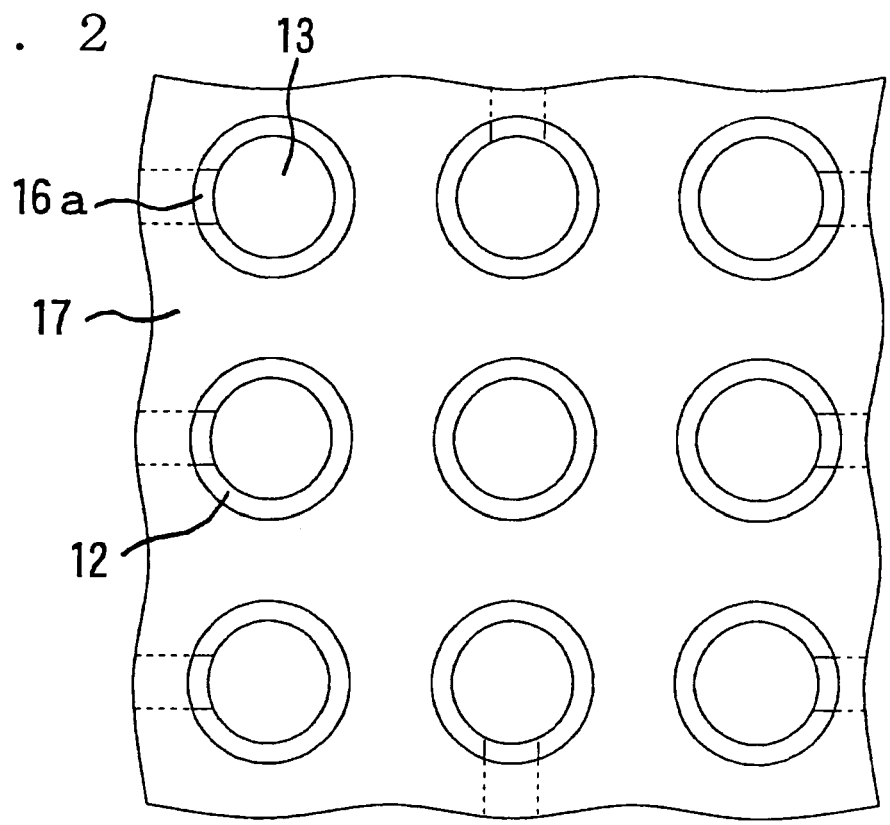
[FIG. 2] illustrates, on an enlarged scale, the front surface of a wiring board for connection in the adaptor for inspection of circuit boards according to the first embodiment.

The wiring board 11 for connection has an insulating substrate 12, and a plurality of connecting electrodes 13 to be electrically connected to electrodes to be inspected of the circuit board to be inspected are formed on a front surface (upper surface in FIG. 1) of this insulating substrate 12 as also shown in FIG. 2. These connecting electrodes 13 are arranged in accordance with a pattern corresponding to a pattern of the electrodes to be inspected of the circuit board to be inspected. Further, an insulating layer 17 is formed on the front surface of the insulating substrate 12 in such a manner that the respective connecting electrodes 13 are exposed. On the other hand, a plurality of terminal electrodes 15 to be electrically connected to inspection electrodes in an inspection electrode device are formed on a back surface (lower surface in FIG. 1) of the insulating substrate 12. These terminal electrodes 15 are arranged in accordance with a pattern corresponding to a pattern of a plurality of inspection electrodes selected from among a great number of inspection electrodes in the inspection electrode device and arranged at positions of lattice points having a pitch of, for example, 2.54 mm, 1.8 mm, 1.27 mm, 1.06 mm, 0.8 mm, 0.75 mm, 0.5 mm, 0.45 mm, 0.3 mm or 0.2 mm. Further, an insulating layer 18 is formed on the back surface of the insulating substrate 12 in such a manner that the respective terminal electrodes 13 are exposed. Each of the connecting electrodes 13 is electrically connected to proper terminal electrode 15 through an internal wiring 16 composed of a patterned wiring part 16a formed on the front surface of the insulating substrate 12 and a via hole 16b extending through in a thickness-wise direction of the insulating substrate 12.

The insulating layer 17 coming into contact with the anisotropically conductive elastomer sheet 20 has a surface roughness of at most 0.2 μm, preferably 0.001 to 0.1 μm, more preferably 0.01 to 0.03 μm on its front surface.

In the present invention, the term "surface roughness" means a center-line average surface roughness Ra prescribed in JIS B 0601.

If the surface roughness on the front surface of the insulating layer 17 is too rough, adhesion to the anisotropically conductive elastomer sheet 20 becomes insufficient, so that it is difficult to prevent the anisotropically conductive elastomer sheet 20 from separating from the wiring board 11 for connection.

The thickness of the insulating layer 17 is preferably 5 to 100 μm, more preferably 10 to 60 μm. If this thickness is too small, it may be difficult in some cases to form an insulating layer 17 having a small surface roughness. If this thickness is too great on the other hand, it may be difficult in some cases to achieve electrical connection between the connecting electrodes 13 and the anisotropically conductive elastomer sheet 20.

The thickness of the insulating layer 18 is preferably 5 to 100 μm, more preferably 10 to 60 μm.

As a material forming the insulating substrate 12, may be used that generally used as a base material for printed wiring boards. As specific preferable examples thereof, may be mentioned polyimide resins, glass fiber-reinforced polyimide resins, glass fiber-reinforced epoxy resins and glass fiber-reinforced bismaleimidotriazine resins.

As a material forming the insulating layers 17 and 18, may be used a polymeric material capable of being molded in the form of a thin film. As specific preferable examples thereof, may be mentioned epoxy resins, acrylic resins, phenol resins, polyimide resins, polyamide resins, mixtures thereof and resist materials.

The wiring board 11 for connection can be produced, for example, in the following manner.

Figure 3:
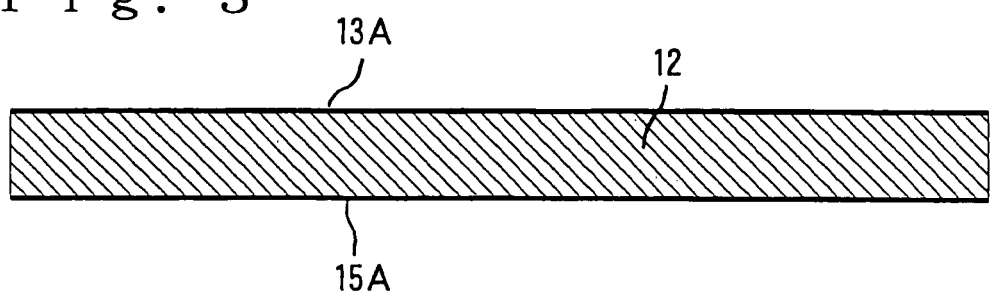
[FIG. 3] is a cross-sectional view illustrating the construction of a laminated material for obtaining the wiring board for connection in the adaptor for inspection of circuit boards according to the first embodiment.
Figure 4:
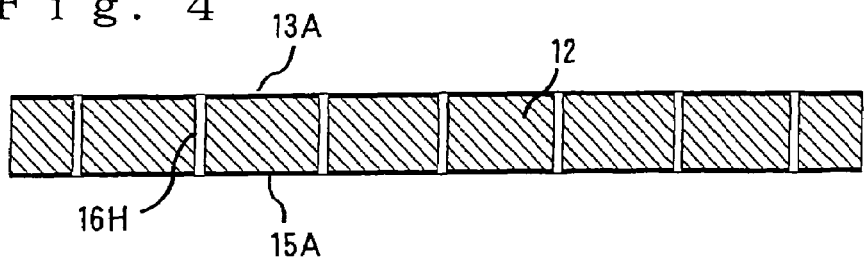
[FIG. 4] is a cross-sectional view illustrating a state that through-holes have been formed in the laminated material shown in FIG. 3.

A laminated material obtained by laminating thin metal layers 13A and 15A on both surfaces of a flat plate-like insulating substrate 12 is first provided as shown in FIG. 3. In this laminated material, a plurality of through-holes 16H each extending through in a thickness-wise direction of the laminated material are formed in accordance with a pattern corresponding to a pattern of terminal electrodes 15 to be formed as shown in FIG. 4. In this invention, as a means for forming the through-holes 16H, may be used a means by a numerically controlled drilling apparatus, or a means by a photo-etching treatment or a laser beam machining treatment.

Figure 5:
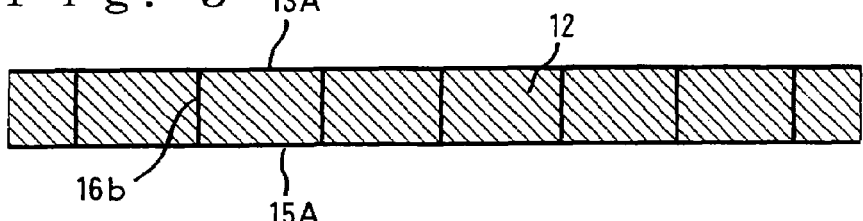
[FIG. 5] is a cross-sectional view illustrating a state that via holes have been formed in the respective through-holes formed in the laminated material.
Figure 6:
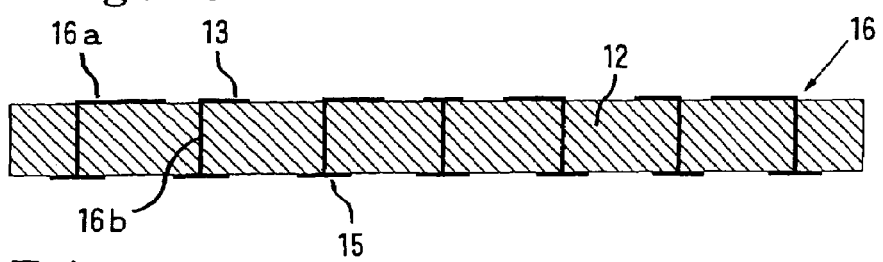
[FIG. 6] illustrates a state that connecting electrodes and pattered wiring parts have been formed on a front surface of an insulating substrate, and terminal electrodes have been formed on a back surface thereof.

The interiors of the through-holes 16H formed in the laminated material are then subjected to an electroless plating treatment and an electroplating treatment, thereby forming via holes 16b connected to the thin metal layers 13A and 15A as shown in FIG. 5. Thereafter, the thin metal layers 13A and 15A are respectively subjected to a photo-etching treatment, thereby forming patterned wiring parts 16a and connecting electrodes 13 on the front surface of the insulating substrate 12 as well as forming terminal electrodes 15 on the back surface of the insulating substrate 12 as shown in FIG. 6.

Figure 7:
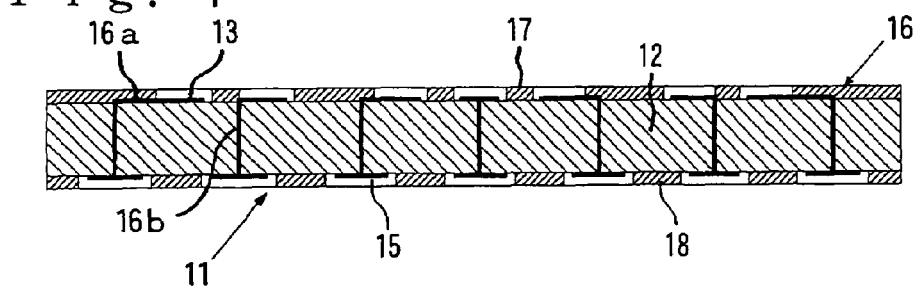
[FIG. 7] is a cross-sectional view illustrating a state that insulating layers have been formed on both surfaces of the insulating substrate.

As shown in FIG. 7, an insulating layer 17 is then formed on the front surface of the insulating substrate 12 in such a manner that the respective connecting electrodes 13 are exposed, and an insulating layer 18 is formed on the back surface of the insulating substrate 12 in such a manner that the respective terminal electrodes 15 are exposed, thereby obtaining the wiring board 11 for connection.

Figure 8:
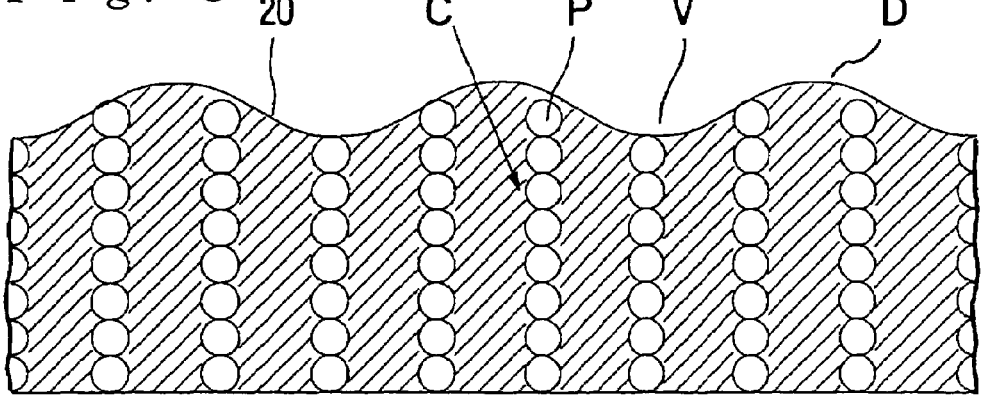
[FIG. 8] illustrates, on an enlarged scale, a part of an anisotropically conductive elastomer sheet in the adaptor for inspection of circuit boards according to the first embodiment.

As also shown on an enlarged scale in FIG. 8, the anisotropically conductive elastomer sheet 20 is such that a great number of conductive particles P exhibiting magnetism are contained in an insulating elastic polymeric substance.

One surface (upper surface in FIG. 8) of this anisotropically conductive elastomer sheet 20, with which a circuit board to be inspected comes into contact, is roughened, whereby projected portions D and recessed portions V are formed at said one surface. On the other hand, the other surface of the anisotropically conductive elastomer sheet 20, with which the wiring board for connection comes into contact, is smoothed.

The anisotropically conductive elastomer sheet 20 has a surface roughness of 0.5 to 5 µm, preferably 1 to 2 µm on said one surface. If this surface roughness is too small, it is difficult to sufficiently suppress the adhesive property on said one surface of such an anisotropically conductive elastomer sheet. If the surface roughness is too great on the other hand, it is difficult to achieve stable electrical connection to the circuit board to be inspected.

The anisotropically conductive elastomer sheet 20 has a surface roughness of at most 0.3 µm, preferably 0.005 to 0.2 µm, more preferably 0.01 to 0.1 µm on the other surface. If this surface roughness is too great, the adhesion to the wiring board 11 for connection becomes insufficient, so that it is difficult to prevent the anisotropically conductive elastomer sheet 20 from separating from the wiring board 11 for connection.

The conductive particles P contained in the anisotropically conductive elastomer sheet 20 are oriented so as to align in a thickness-wise direction of the anisotropically conductive elastomer sheet 20, thereby forming a plurality of chains C of the conductive particles P. The chains C of the conductive particles P are formed in a state distributed in a plane direction of the anisotropically conductive elastomer sheet 20 irrespective of the positions of the projected portions D and the recessed portions V in the one surface of the anisotropically conductive elastomer sheet 20.

No particular limitation is imposed on the minimum thickness of the anisotropically conductive elastomer sheet 20. However, the minimum thickness is preferably 0.03 to 0.3 mm, more preferably 0.05 to 0.2 mm. If this minimum thickness is smaller than 0.03 mm, the mechanical strength of the anisotropically conductive elastomer sheet 20 is liable to become low, so that necessary durability may not be achieved in some cases. If this minimum thickness exceeds 0.3 mm on the other hand, an electric resistance in the thickness-wise direction is liable to become high, and necessary insulating property among conductive paths formed by pressurization may not be achieved in some cases when the pitch of electrodes to be connected is small.

The elastic polymeric substance forming the anisotropically conductive elastomer sheet 20 is preferably a polymeric substance having a crosslinked structure. As a curable polymeric substance-forming material usable for obtaining a crosslinked polymeric substance, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene rubber, urethane rubber, polyester rubber, epichlorohydrin rubber, silicone rubber, ethylene-propylene copolymer rubber and ethylene-propylene-diene terpolymer rubber.

When weather resistance is required of the resulting anisotropically conductive elastomer sheet 20 in the embodiment described above, any other material than conjugated diene rubbers is preferably used. In particular, silicone rubber is preferably used from the viewpoints of molding or forming and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxy-silane and successively fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and successively fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochloro-silane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

As the liquid silicone rubber, is preferably used that having a compression set of at most 35%, more preferably at most 20% as measured in the form of a cured product at 150° C. When this compression set is at most 35%, the resulting anisotropically conductive elastomer sheet 20 comes to have good durability when it is compressed repeatedly in its thickness-wise direction. It is hence preferable to have such a compression set.

As the liquid silicone rubber, is preferably used that having tear strength of at least 7 kN/m, more preferably at least 10 kN/m as measured in the form of a cured product at 23° C. When this tear strength is 7 kN/m or higher, the resulting anisotropically conductive elastomer sheet 20 comes to have good durability when it is compressed repeatedly in its thickness-wise direction. It is hence preferable to have such tear strength.

In the present invention, the compression set and tear strength of the cured product of the liquid silicone rubber can be measured by methods in accordance with JIS K 6249.

Such an elastic polymeric substance preferably has a molecular weight Mw (weight average molecular weight as determined in terms of standard polystyrene) of 10,000 to 40,000. It also preferably has a molecular weight distribution index (a ratio Mw/Mn of weight average molecular weight Mw as determined in terms of standard polystyrene to number average molecular weight. Mn as determined in terms of standard polystyrene) of at most 2 from the viewpoint of heat resistance of the resulting anisotropically conductive elastomer sheet 20.

In the above, a curing catalyst for curing the polymeric substance-forming material may be contained in the polymeric substance-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by weight per 100 parts by weight of the polymeric substance-forming material.

In the elastic polymeric substance, as needed, may be contained an inorganic filler such as ordinary silica powder, colloidal silica, aerogel silica or alumina. By containing such an inorganic filler, the thixotropic property of the resulting molding material for obtaining the anisotropically conductive elastomer sheet 20 is ensured, the viscosity thereof becomes high, the dispersion stability of the conductive particles is improved, and moreover the strength of the resulting anisotropically conductive elastomer sheet 20 can be made high.

No particular limitation is imposed on the amount of such an inorganic filler used. However, the use in a too great amount is not preferred because the orientation of the conductive particles by a magnetic field cannot be sufficiently achieved.

The viscosity of the sheet-forming material is preferably within a range of 100,000 to 1,000,000 cp at a temperature of 25° C.

As the conductive particles P contained in the base material, conductive particles exhibiting magnetism are preferably used from the viewpoint of permitting them to be easily oriented so as to align in a thickness-wise direction of the anisotropically conductive elastomer sheet 20 by applying a magnetic field. Specific examples of such conductive particles P include particles of metals exhibiting magnetism, such as nickel, iron and cobalt and particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic substance such as nickel or cobalt, and particles obtained by coating the core particles with both conductive magnetic substance and metal having good conductivity.

Among these, particles obtained by using particles composed of a ferromagnetic substance, for example, nickel particles as core particles and plating their surfaces with a metal having good conductivity, particularly gold are preferably used.

No particular limitation is imposed on a means for coating the surfaces of the core particles with the conductive metal. However, the coating may be conducted by, for example, chemical plating or electroplating.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by weight, more preferably 1 to 30% by weight, still more preferably 3 to 25% by weight, particularly preferably 4 to 20% by weight based on the core particles. When the conductive metal to coat is gold, the coating amount thereof is preferably 2 to 30% by weight, more preferably 3 to 20% by weight, still more preferably 3.5 to 17% by weight based on the core particles.

The particle diameter of the conductive particles P is preferably 1 to 1,000 μm, more preferably 2 to 500 μm, further preferably 5 to 300 μm, particularly preferably 10 to 200 μm. The particle diameter distribution (Dw/Dn) of the conductive particles P is preferably 1 to 10, more preferably 1.01 to 7, further preferably 1.05 to 5, particularly preferably 1.1 to 4.

Conductive particles P satisfying such conditions are used, whereby sufficient electrical contact is achieved among such conductive particles.

No particular limitation is imposed on the form of the conductive particles P. However, they are preferably in the form of a sphere or star, or a mass of secondary particles obtained by aggregating these particles from the viewpoint of permitting them to be easily dispersed in the polymeric substance-forming material.

The water content in the conductive particles P is preferably at most 5%, more preferably at most 3%, still more preferably at most 2%, particularly preferably at most 1%. The use of conductive particles P satisfying such conditions prevents or inhibits occurrence of bubbles upon a curing treatment of the polymeric substance-forming material.

Those obtained by treating surfaces of the conductive particles with a coupling agent such as a silane coupling agent may be suitably used as the conductive particles P. By treating the surfaces of the conductive particles with the coupling agent, the adhesion property of the conductive particles to the elastic polymeric substance is improved, so that the resulting anisotropically conductive elastomer sheet 20 is improved in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles amounts to at least 5%, more preferably 7 to 100%, still more preferably 10 to 100%, particularly preferably 20 to 100%.

The conductive particles P are preferably contained in the anisotropically conductive elastomer sheet 20 in a proportion of 5 to 30%, more preferably 7 to 27%, particularly preferably 10 to 25% in terms of volume fraction. When this proportion is at least 5%, conductive parts sufficiently small in electric resistance value are formed in the thickness-wise direction. When the proportion is at most 30% on the other hand, the resulting anisotropically conductive elastomer sheet 20 comes to have necessary elasticity. It is hence preferable to contain the conductive particles P in such a range.

In the anisotropically conductive elastomer sheet 20, the number (the number of the conductive particles P for forming a conductive path in the thickness-wise direction; hereinafter also referred to as "number of conductive path-forming particles") of the conductive particles P aligned in the thickness-wise direction thereof is preferably 3 to 20 particles, more preferably 5 to 15 particles. When the number of conductive path-forming particles is 3 particles or more, a scatter of an electric resistance value in such an anisotropically conductive elastomer sheet 20 becomes narrow. When the number of conductive path-forming particles is 20 particles or less on the other hand, the deformation of the chains of the conductive particles P does not become great upon compression of such an anisotropically conductive elastomer sheet 20, and so rise in resistance value is scarcely incurred. It is hence preferable to control the number of the conductive particles within such a range.

In the anisotropically conductive elastomer sheet 20, an antistatic agent may be contained within limits not impairing the insulating property of the elastic polymeric substance.

As such antistatic agents, may be used: nonionic antistatic agents such as N,N-bis(2-hydroxyethyl) alkylamines, polyoxyethylene alkylamines, fatty acid esters of polyoxyethylene alkylamines, glycerol fatty acid esters, sorbitan fatty acid esters, polyoxyethylene sorbitan fatty acid esters, polyoxyethylene aliphatic alcohol ethers, polyoxyethylene alkyl phenyl ethers and polyethylene glycol fatty acid esters; anionic antistatic agents such as alkylsulfonic acid salts, alkylbenzenesulfonic acid salts, alkyl sulfates and alkyl phosphates; cationic antistatic agents such as tetraalkylammonium salts and trialkylbenzylammonium salts; and amphoteric antistatic agents such as alkylbetaines and imidazoline type amphoteric compounds.

Such an antistatic agent is contained in the anisotropically conductive elastomer sheet 20, whereby the anisotropically conductive elastomer sheet 20 is prevented or inhibited from accumulating electric charge on the surface thereof, so that when the anisotropically conductive elastomer sheet is used in, for example, electrical inspection of circuit boards, inconveniences by discharge of electric charge from the anisotropically conductive elastomer sheet 20 upon inspection can be prevented, and moreover good conductivity can be achieved with still smaller pressurizing force.

In order to surely exhibit such effects as described above, it is preferable to contain the antistatic agent in such a manner that the volume resistivity of the base material composed of the elastic polymeric substance forming the anisotropically conductive elastomer sheet 20 is $1 \times 10^9$ to $1 \times 10^{13} \Omega \cdot cm$.

The anisotropically conductive elastomer sheet 20 can be produced, for example, in the following manner.

Figure 9:
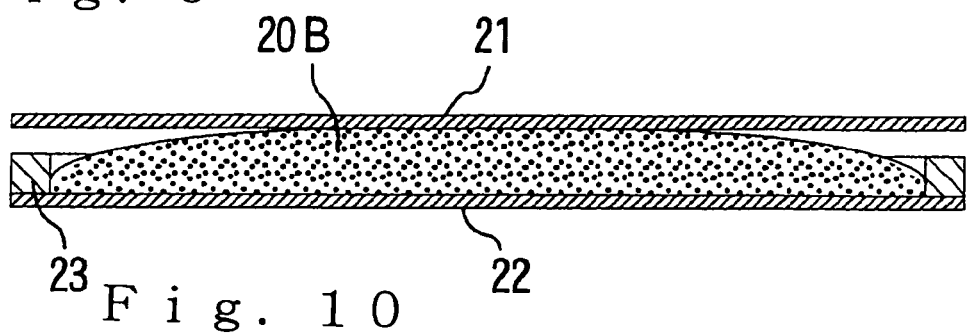
[FIG. 9] is a cross-sectional view illustrating a state that one surface-side molding member has been superimposed on a molding material applied on to a molding surface of the other surface-side molding member.

A flowable molding material is first prepared by dispersing conductive particles exhibiting magnetism in a liquid polymeric substance-forming material, which will become an elastic polymeric substance by being cured, and at the same time, as illustrated in FIG. 9, one surface-side molding member 21 and the other surface-side molding member 22, which are each composed of a non-magnetic sheet, are provided. A frame-like spacer 23, which has an opening having a shape fitted to a plane shape of the intended anisotropically conductive elastomer sheet and a thickness corresponding to the thickness of the anisotropically conductive elastomer sheet, is arranged on a molding surface (upper surface in FIG. 9) of the other surface-side molding member 22, the molding material 20B prepared is applied to within the opening of the spacer 23 on the molding surface of the other surface-side molding member 22, and the one surface-side molding member 21 is arranged on this molding material 20B in such a manner that its molding surface (lower surface in FIG. 9) comes into contact with the molding material 20B.

In the above-described process, resin sheets composed of a polyimide resin, polyester resin, acrylic resin or the like may be used as non-magnetic sheets forming the one surface-side molding member 21 and the other surface-side molding member 22.

Figure 10:
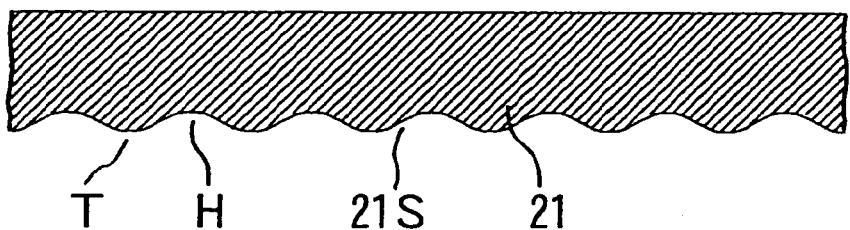
[FIG. 10] is a cross-sectional view illustrating, on an enlarged scale, a part of the one surface-side molding member.

As the one surface-side molding member 21, is used a member, the molding surface 21S of which has been subjected to a roughening treatment to form projected portions T and recessed portions H at the molding surface 21S, as illustrated in FIG. 10. As specific methods for conducting the roughening treatment on the molding surface of the one surface-side molding member 21, may be mentioned a sandblasting method, an etching method and the like. On the other hand, as the other surface-side molding member 22, is used a member having a flat molding surface.

The surface roughness of the molding surface 21S in the one surface-side molding member 21 is set according to the intended surface roughness of one surface of the resulting anisotropically conductive elastomer sheet 20 and specifically controlled to 0.5 to 5 µm, preferably 1 to 2 µm.

On the other hand, the surface roughness of the molding surface in the other surface-side molding member 22 is set according to the intended surface roughness of the other surface of the resulting anisotropically conductive elastomer sheet 20 and specifically controlled to at most 0.3 µm, preferably 0.1 to 0.2 µm.

The thickness of each of the non-magnetic sheets making up the one surface-side molding member 21 and the other surface-side molding member 22 is preferably 50 to 500 µm, more preferably 75 to 300 µm. If this thickness is smaller than 50 µm, strength required of the molding member may not be achieved in some cases. If this thickness exceeds 500 µm on the other hand, it may be difficult in some cases to apply a magnetic field of necessary intensity to a molding material layer, which will be described subsequently.

Figure 11:
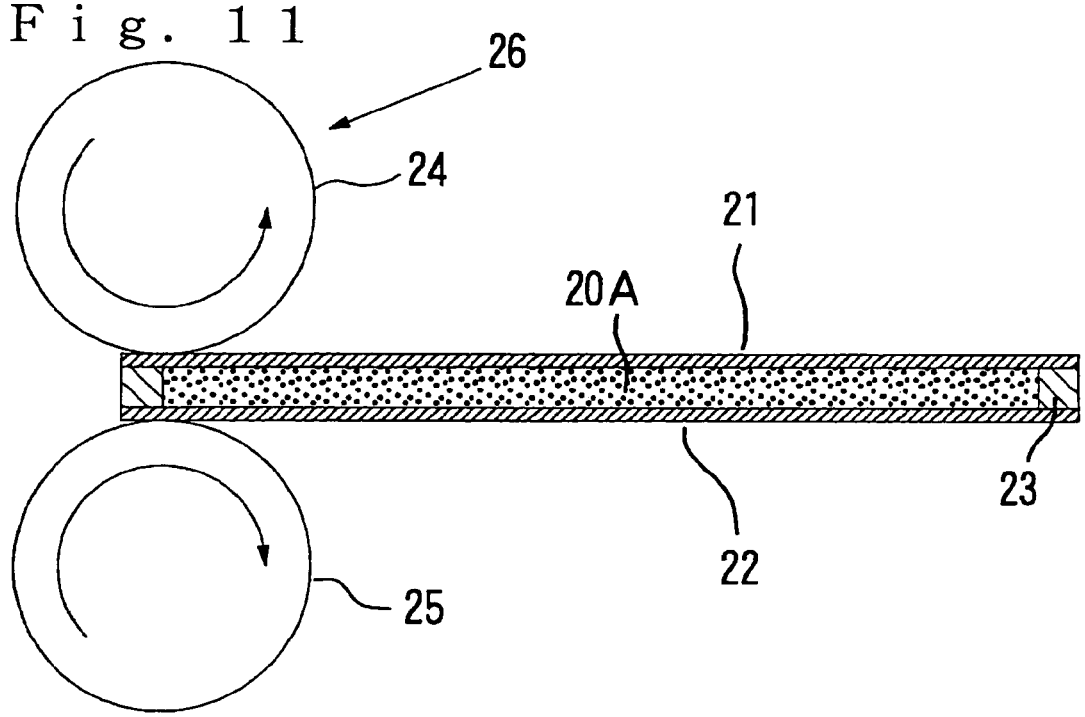
[FIG. 11] is a cross-sectional view illustrating a state that a molding material layer having a necessary thickness has been formed between the one surface-side molding member and the other surface-side molding member.
Figure 12:
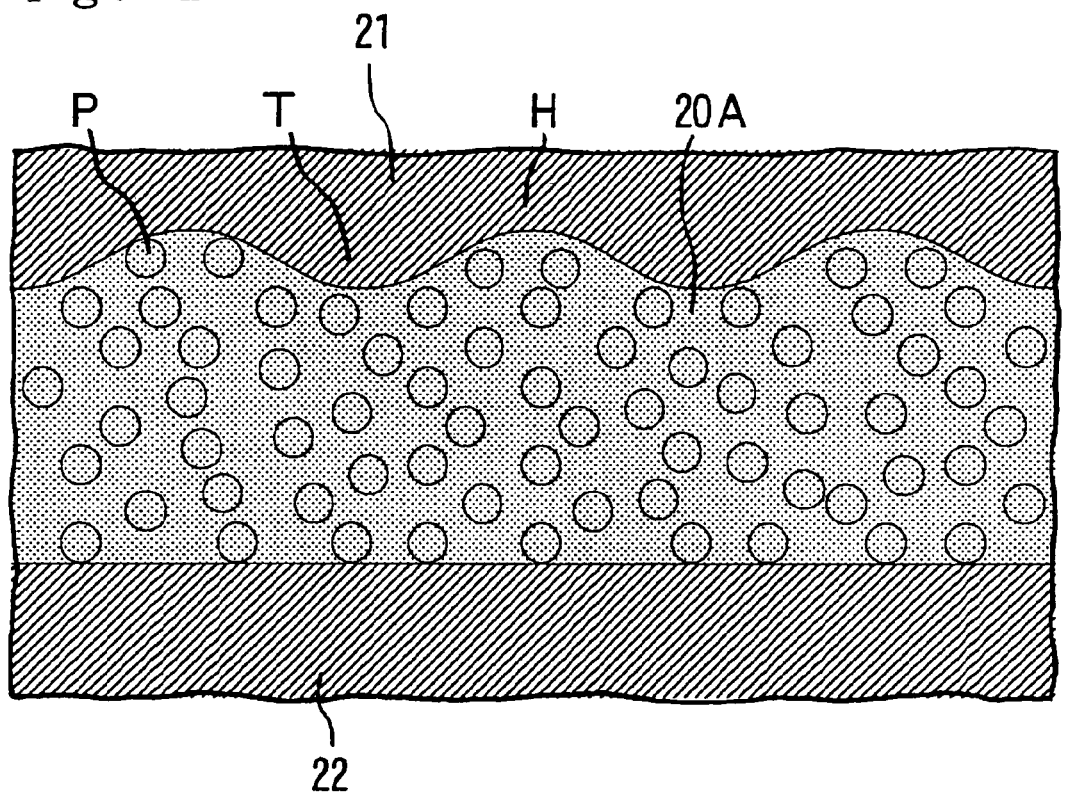
[FIG. 12] is a cross-sectional view illustrating a dispersed state of conductive particles in the molding material layer.

As illustrated in FIG. 11, a pressure roll device 26 composed of a pressure roll 24 and a supporting roll 25 is used to pinch the molding material by the one surface-side molding member 21 and the other surface-side molding member 22, thereby forming a molding material layer 20A having a necessary thickness between the one surface-side molding member 21 and the other surface-side molding member 22. In this molding material layer 20A, as shown on an enlarged scale in FIG. 12, the conductive particles P are contained in an evenly dispersed state.

Figure 13:
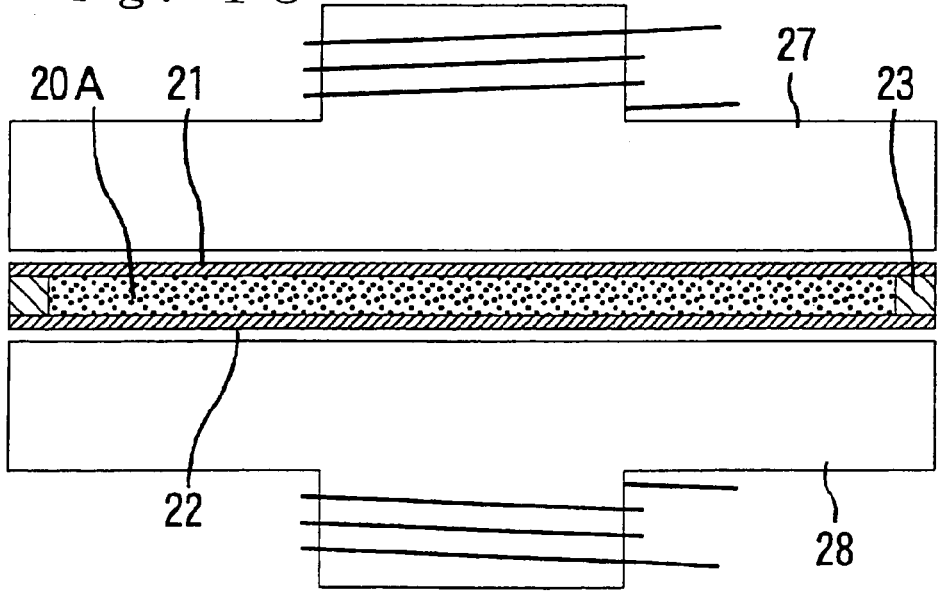
[FIG. 13] is a cross-sectional view illustrating an apparatus for producing an anisotropically conductive elastomer sheet.
Figure 14:
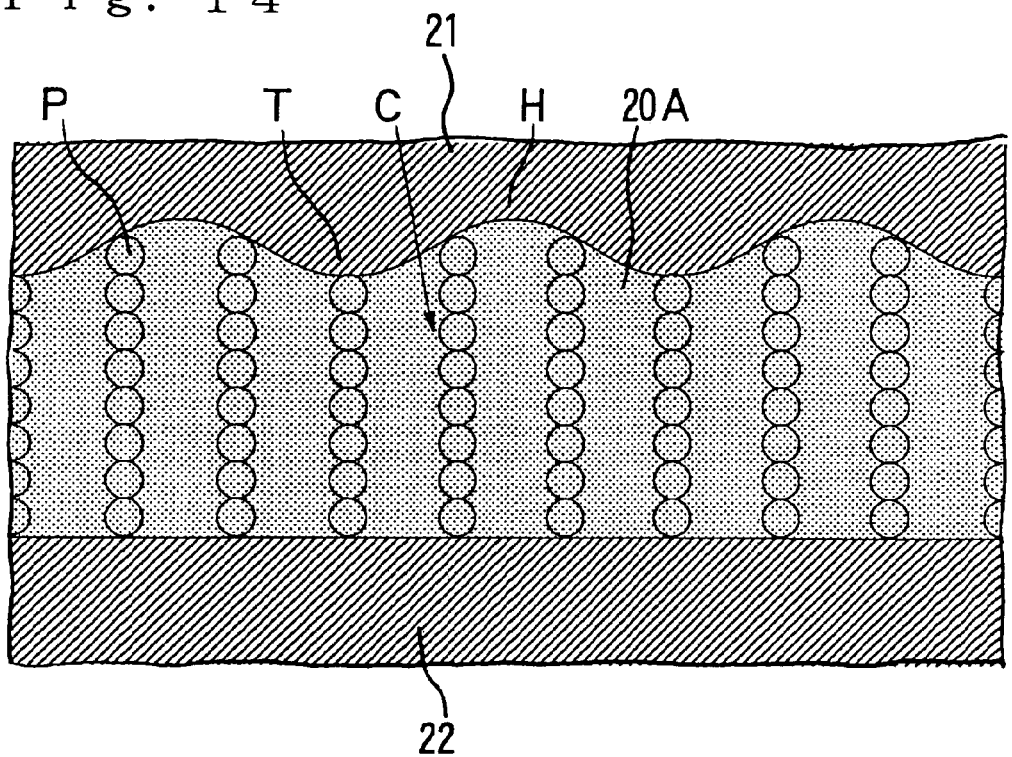
[FIG. 14] is a cross-sectional view illustrating a state that a magnetic field has been applied to a molding material layer in a thickness-wise direction thereof to form chains.

As illustrated in FIG. 13, for example, a pair of electromagnets 27 and 28 are then arranged on a back surface (upper surface in FIG. 13) of the one surface-side molding member 21 and a back surface (lower surface in FIG. 13) of the other surface-side molding member 22, and the electromagnets 27 and 28 are operated, thereby applying a parallel magnetic field to the molding material layer 20A in its thickness-wise direction. As a result, the conductive particles P dispersed in the molding material layer 20A are oriented so as to align in the thickness-wise direction while retaining the state distributed in a plane direction as illustrated in FIG. 14, whereby a plurality of chains C each composed of the conductive particles P and extending in the thickness-wise direction are formed in the state distributed in the plane direction.

In this state, the molding material layer 20A is subjected to a curing treatment, thereby producing an anisotropically conductive elastomer sheet 20 containing the conductive particles P in a state oriented so as to align in the thickness-wise direction in the elastic polymeric substance and distributed in the plane direction.

In the above-described process, the curing treatment of the molding material layer 20A may be conducted in the state that the parallel magnetic field is being applied. However, the treatment may also be conducted after stopping the application of the parallel magnetic field.

The intensity of the parallel magnetic field applied to the molding material layer 20A is preferably an intensity that it amounts to 0.02 to 1.5 tesla on the average.

As a means for applying the parallel magnetic field to the molding material layer 20A, permanent magnets may also be used in place of the electromagnets. As such permanent magnets, are preferred those composed of alunico (Fe—Al—Ni—Co alloy), ferrite or the like in that the intensity of the parallel magnetic field within the above range is achieved.

The curing treatment of the molding material layer 20A is suitably selected according to the material used. However, the treatment is generally conducted by a heat treatment. Specific heating temperature and heating time are suitably selected in view of the kinds of the polymeric substance-forming material making up the molding material layer 20A, and the like, the time required for movement of the conductive particles P, and the like.

According to such a process, the molding surface 21S of the one surface-side molding member 21, with which the molding material layer 20A comes into contact, is subjected to the roughening treatment corresponding to the surface roughness of one surface of an anisotropically conductive elastomer sheet 20 to be produced, and moreover the molding surface of the other surface-side molding member 22, with which the molding material layer 20A comes into contact, is formed into a flat surface corresponding to the surface roughness of the other surface of the anisotropically conductive elastomer sheet 20 to be produced, so that the anisotropically conductive elastomer sheet 20 obtained by the curing treatment comes to have one roughened surface and the other flat surface. Accordingly, the anisotropically conductive elastomer sheet 20 itself does not need to be subjected to the roughening treatment, i.e., a post treatment, so that the anisotropically conductive elastomer sheet 20 can be easily produced by a simple process, and moreover the adverse influence on the anisotropically conductive elastomer sheet 20 by the post treatment can be avoided.

In addition, a member composed of a non-magnetic substance, the molding surface 21S of which has been subjected to the roughening treatment, is used as the one surface-side molding member 21, whereby a magnetic field having even intensity in a plane direction can be applied to the molding material layer 20A. In other words, since it is avoided to form a magnetic field having higher intensity at positions of the projected portions T of the molding surface 21S subjected to the roughening treatment in the one surface-side molding member 21 than positions of the recessed portions H thereof, it is avoided to selectively form chains C of the conductive particles P at the positions of the projected portions T of the molding surface 21S in the one surface-side molding member 21 when the magnetic field is applied to the molding material layer 20A. As a result, in the resulting anisotropically conductive elastomer sheet 20, the chains C of the conductive particles P are not selectively formed at positions of the recessed portions V in the roughened one surface of the anisotropically conductive elastomer sheet 20, but formed in a state distributed in the plane direction of the anisotropically conductive elastomer sheet 20, whereby the chains C of the conductive particles P come to be surely present even at positions of the projected portions D in said one surface of the anisotropically conductive elastomer sheet 20. Therefore, conductivity is attained in the thickness-wise direction of the anisotropically conductive elastomer sheet 20 even in a state that only the projected portions D in said one surface of the anisotropically conductive elastomer sheet 20 have been pressurized. Accordingly, an anisotropically conductive elastomer sheet 20 exhibiting high conductivity with small pressurizing force can be provided.

In addition, those composed of a non-magnetic film such as a resin film are used as the one surface-side molding member 21 and the other surface-side molding member 22, whereby production cost can be reduced compared with the case where expensive molding members such as molds are used.

Figure 15:
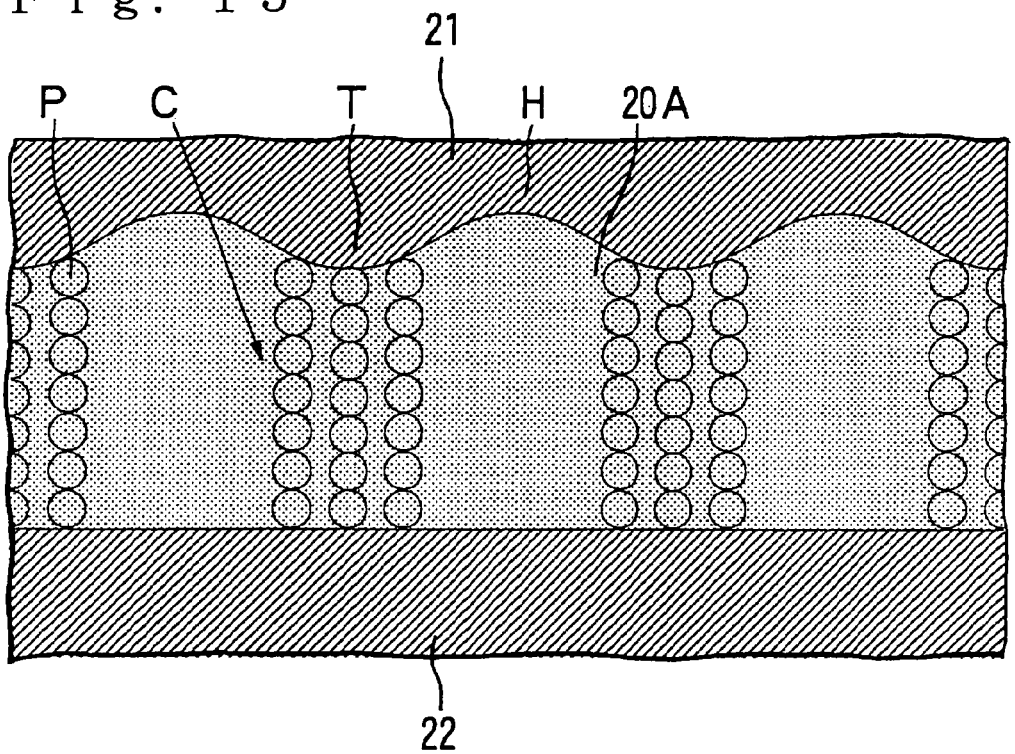
[FIG. 15] is a cross-sectional view illustrating a distributed state of chains by conductive particles when a magnetic field has been applied to a molding material layer in a thickness-wise direction thereof in the case where one surface-side molding member composed of a magnetic substance has been used.
Figure 16:
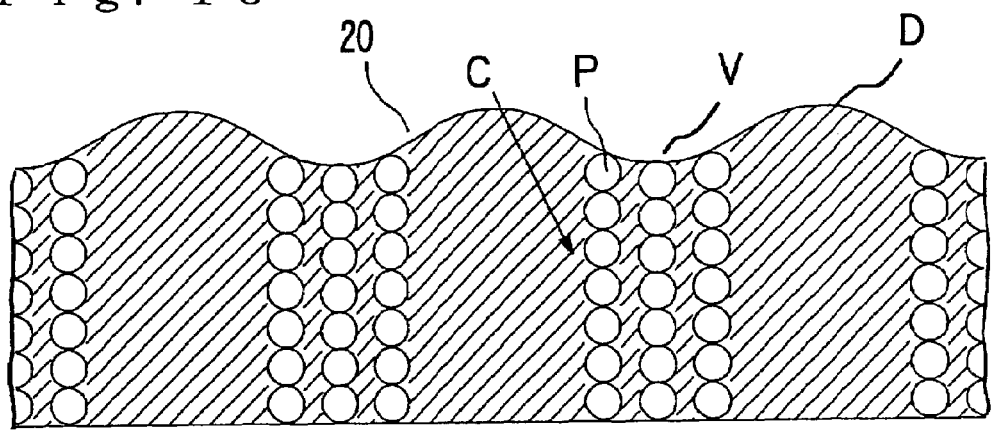
[FIG. 16] is a cross-sectional view illustrating a distributed state of chains by the conductive particles in an anisotropically conductive elastomer sheet produced by using the one surface-side molding member composed of the magnetic substance.

When that composed of a magnetic substance is used as the one surface-side molding member 20 in the above-described process, a magnetic field having higher intensity is formed at positions of the projected portions T of the molding surface 21S in the one surface-side molding member 21 than other positions, particularly, positions of the recessed portions H when a magnetic field is applied to the molding material layer 20A in the thickness-wise direction thereof, so that the conductive particles P are gathered at the positions of the projected portions T as shown in FIG. 15 to form chains C of the conductive particles P there. In the resulting anisotropically conductive elastomer sheet 20, the chains C of the conductive particles P are selectively formed at positions of the recessed portions V in the roughened one surface as shown in FIG. 16. As a result, the conductive particles P are not present at all or scarcely present at the positions of the projected portions V in one surface of the anisotropically conductive elastomer sheet 20, so that conductivity is not achieved in the thickness-wise direction of the anisotropically conductive elastomer sheet 20 in a state that only the projected portions D in said one surface thereof have been pressurized. Accordingly, great pressurizing force is required to achieve sufficient conductivity.

In the adaptor 10 for inspection of circuit boards according to the first embodiment, a circuit board to be inspected, which has been conveyed to an inspection-executing region in an inspection apparatus by a proper conveying mechanism, is pressed by the anisotropically conductive elastomer sheet 20, whereby the anisotropically conductive elastomer sheet 20 is in a state pinched by the circuit board to be inspected and the wiring board 11 for connection. As a result, in the anisotropically conductive elastomer sheet 20, conductive paths by the chains of the conductive particles P are formed between an electrode to be inspected of the circuit board to be inspected and the connecting electrode 13 of the wiring board 11 for connection, whereby electrical connection of the electrode to be inspected of the circuit board to be inspected to the connecting electrode 13 of the wiring board 11 for connection is achieved. In this state, necessary electrical inspection as to the circuit board to be inspected is conducted.

After completion of the electrical inspection as to the circuit board to be inspected, this circuit board to be inspected is conveyed from the inspection-executing region to a proper place, another circuit board to be inspected is conveyed to the inspection-executing region, and the above-described operation is repeated on said another circuit board to be inspected, thereby conducting the electrical inspection.

According to such an adaptor 10 for inspection of circuit boards of the first embodiment, one surface of the anisotropically conductive elastomer sheet 20, with which the circuit board to be inspected comes into contact, is roughened in such a manner the surface roughness thereof falls within the specific range, whereby a contact area between the circuit board to be inspected and the anisotropically conductive elastomer sheet 20 is small when pressurization against the circuit board to be inspected is released, so that the adhesion property that the elastic polymeric substance forming the anisotropically conductive elastomer sheet 20 has can be suppressed, thereby preventing or inhibiting the anisotropically conductive elastomer sheet 20 from adhering to the circuit board to be inspected.

In addition, the other surface of the anisotropically conductive elastomer sheet 20, with which the wiring board 11 for connection comes into contact, is formed into a flat surface having a small surface roughness, and the wiring board 11 for connection has, on its front surface, the insulating layer 17 having a small surface roughness, so that a contact area between the wiring board 11 for connection and the anisotropically conductive elastomer sheet 20 is great even when the pressurization against the circuit board to be inspected is released, and the adhesion between both becomes high, whereby the adhesion property that the elastic polymeric substance forming the anisotropically conductive elastomer sheet 20 has can be fully exhibited. As a result, the anisotropically conductive elastomer sheet 20 can be surely held by the wiring board 11 for connection, thereby preventing the anisotropically conductive elastomer sheet 20 from separating from the wiring board 11 for connection.

Accordingly, the inspection operation can be smoothly carried out even when electrical inspection is continuously conducted on a great number of circuit boards to be inspected.

Since the anisotropically conductive elastomer sheet 20 is detachably provided on the wiring board 11 for connection, the anisotropically conductive elastomer sheet 20 can be easily replaced by a new one even when the anisotropically conductive elastomer sheet 20 suffers from trouble.

Further, since there is no need to mechanically fix the anisotropically conductive elastomer sheet 20 to the wiring board 11 for connection by a fixing tool, it can be avoided to damage the anisotropically conductive elastomer sheet 20 by the fixing tool, whereby the original service life of the anisotropically conductive elastomer sheet 20 can be attained.

In addition, the chains C of the conductive particles P are formed in a state distributed in the plane direction of the anisotropically conductive elastomer sheet 20 and surely exist even at the positions of the projected portions in one surface of the anisotropically conductive elastomer sheet 20, so that conductivity is attained in the thickness-wise direction of the anisotropically conductive elastomer sheet 20 even in a state that only the projected portions D in said one surface of the anisotropically conductive elastomer sheet 20 have been pressurized. Accordingly, high conductivity is attained with small pressurizing force.

Figure 17:
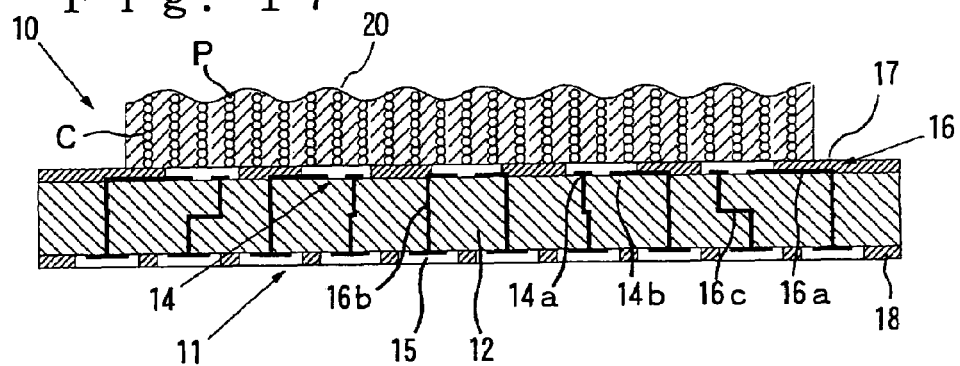
[FIG. 17] is a cross-sectional view illustrating the construction of an adaptor for inspection of circuit boards according to the second embodiment of the present invention.

FIG. 17 is a cross-sectional view illustrating the construction of an adaptor for inspection of circuit boards according to the second embodiment of the present invention. This adaptor 10 for inspection of circuit boards is used for carrying out an electric resistance-measuring test on each wiring pattern as to circuit boards to be inspected and has a wiring board 11 for connection and an anisotropically conductive elastomer sheet 20 detachably provided on a front surface (upper surface in FIG. 17) of this wiring board 11 for connection.

Figure 18:
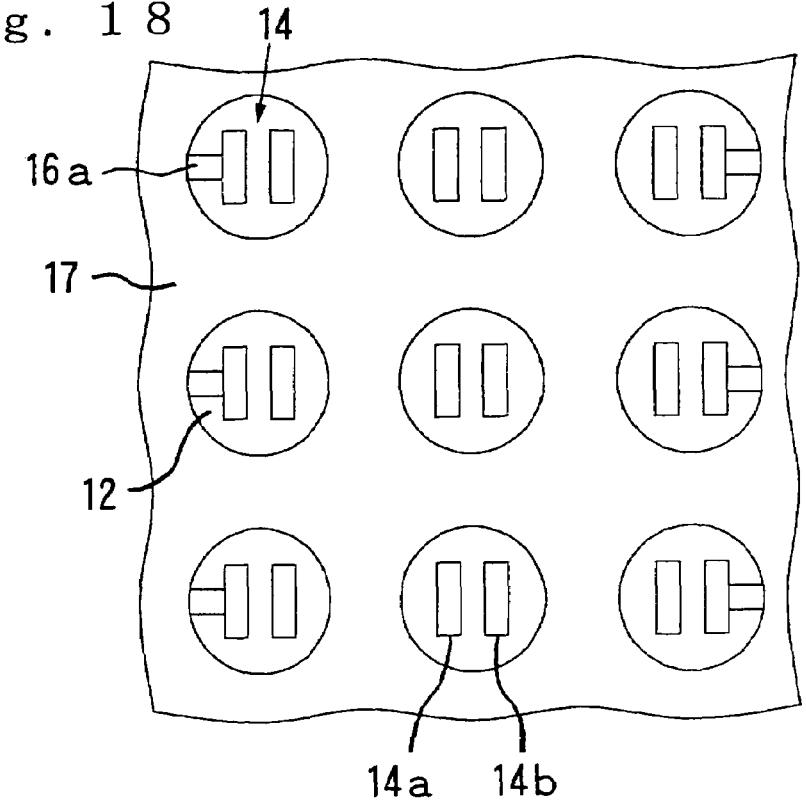
[FIG. 18] illustrates, on an enlarged scale, the front surface of a wiring board for connection in the adaptor for inspection of circuit boards according to the second embodiment.

The wiring board 11 for connection has an insulating substrate 12 of a multi-layer structure, and plural pairs 14 of connecting electrodes each composed of a pair of a connecting electrode 14a for current supply and a connecting electrode 14b for voltage measurement, which are electrically connected to the same electrode to be inspected and arranged in relation separated from each other, are formed on a front surface (upper surface in FIG. 17) of this insulating substrate 12 as also shown in FIG. 18. These pairs 14 of connecting electrodes each composed of the connecting electrode 14a for current supply and the connecting electrode 14b for voltage measurement are arranged in accordance with a pattern corresponding to a pattern of the electrodes to be inspected of the circuit board to be inspected. Further, an insulating layer 17 is formed on the front surface of the insulating substrate 12 in such a manner that the connecting electrodes 14a for current supply and the connecting electrodes 14b for voltage measurement in the respective pairs 14 of connecting electrodes are exposed. On the other hand, a plurality of terminal electrodes 15 to be electrically connected to inspection electrodes in an inspection electrode device are formed on a back surface (lower surface in FIG. 17) of the insulating substrate 12. These terminal electrodes 15 are arranged in accordance with a pattern corresponding to a pattern of a plurality of inspection electrodes selected from among a great number of inspection electrodes in the inspection electrode device and arranged at positions of lattice points having a pitch of, for example, 2.54 mm, 1.8 mm, 1.27 mm, 1.06 mm, 0.8 mm, 0.75 mm, 0.5 mm, 0.45 mm, 0.3 mm or 0.2 mm. Further, an insulating layer 18 is formed on the back surface of the insulating substrate 12 in such a manner that the respective terminal electrodes 15 are exposed. Each of the connecting electrodes 14a for current supply and each of the connecting electrodes 14b for voltage measurement are electrically connected to proper terminal electrode 15 through an internal wiring 16 composed of a patterned wiring part 16.a formed on the front surface of the insulating substrate 12, a via hole 16b extending through in a thickness-wise direction of the insulating substrate 12 and an interlayer patterned wiring part 16c formed between the layers of the insulating substrate 12. On the other hand, other constitutions are basically the same as the wiring board 11 for connection in the adaptor 10 for inspection of circuit boards according to the first embodiment.

The construction of the anisotropically conductive elastomer sheet 20 is basically the same as the anisotropically conductive elastomer sheet 20 in the adaptor 10 for inspection of circuit boards according to the first embodiment.

In the adaptor 10 for inspection of circuit boards according to the second embodiment, a circuit board to be inspected, which has been conveyed to an inspection-executing region in an inspection apparatus by a proper conveying mechanism, is pressed by the anisotropically conductive elastomer sheet 20, whereby the anisotropically conductive elastomer sheet 20 is in a state pinched by the circuit board to be inspected and the wiring board 11 for connection. As a result, in the anisotropically conductive elastomer sheet 20, conductive paths by the chains of the conductive particles P are formed between an electrode to be inspected of the circuit board to be inspected and each of the electrode 14a for current supply and the electrode 14b for voltage measurement in the pair 14 of connecting electrodes of the wiring board 11 for connection, whereby both connecting electrode 14a for current supply and connecting electrode 14b for voltage measurement in one pair 14 of connecting electrodes are electrically connected to one electrodes to be inspected in the circuit board to be inspected at the same time. In this state, necessary electrical inspection as to the circuit board to be inspected, i.e., measurement of an electric resistance of each wiring pattern is conducted.

After completion of the electrical inspection as to the circuit board to be inspected, this circuit board to be inspected is conveyed from the inspection-executing region to a proper place, another circuit board to be inspected is conveyed to the inspection-executing region, and the above-described operation is repeated on said another circuit board to be inspected, thereby conducting the electrical inspection.

According to such an adaptor 10 for inspection of circuit boards of the second embodiment, the same effects as in the adaptor 10 for inspection of circuit boards of the first embodiment are brought about. More specifically, the anisotropically conductive elastomer sheet 20 can be prevented or inhibited from adhering to the circuit board to be inspected. In addition, the anisotropically conductive elastomer sheet 20 can be prevented from separating from the wiring board 11 for connection. Accordingly, the inspection operation can be smoothly carried out even when electrical inspection is continuously conducted on a great number of circuit boards to be inspected. Further, the anisotropically conductive elastomer sheet 20 can be easily replaced by a new one even when the anisotropically conductive elastomer sheet 20 suffers from trouble, the original service life of the anisotropically conductive elastomer sheet 20 can be attained, and moreover high conductivity is attained with small pressurizing force.

Figure 19:
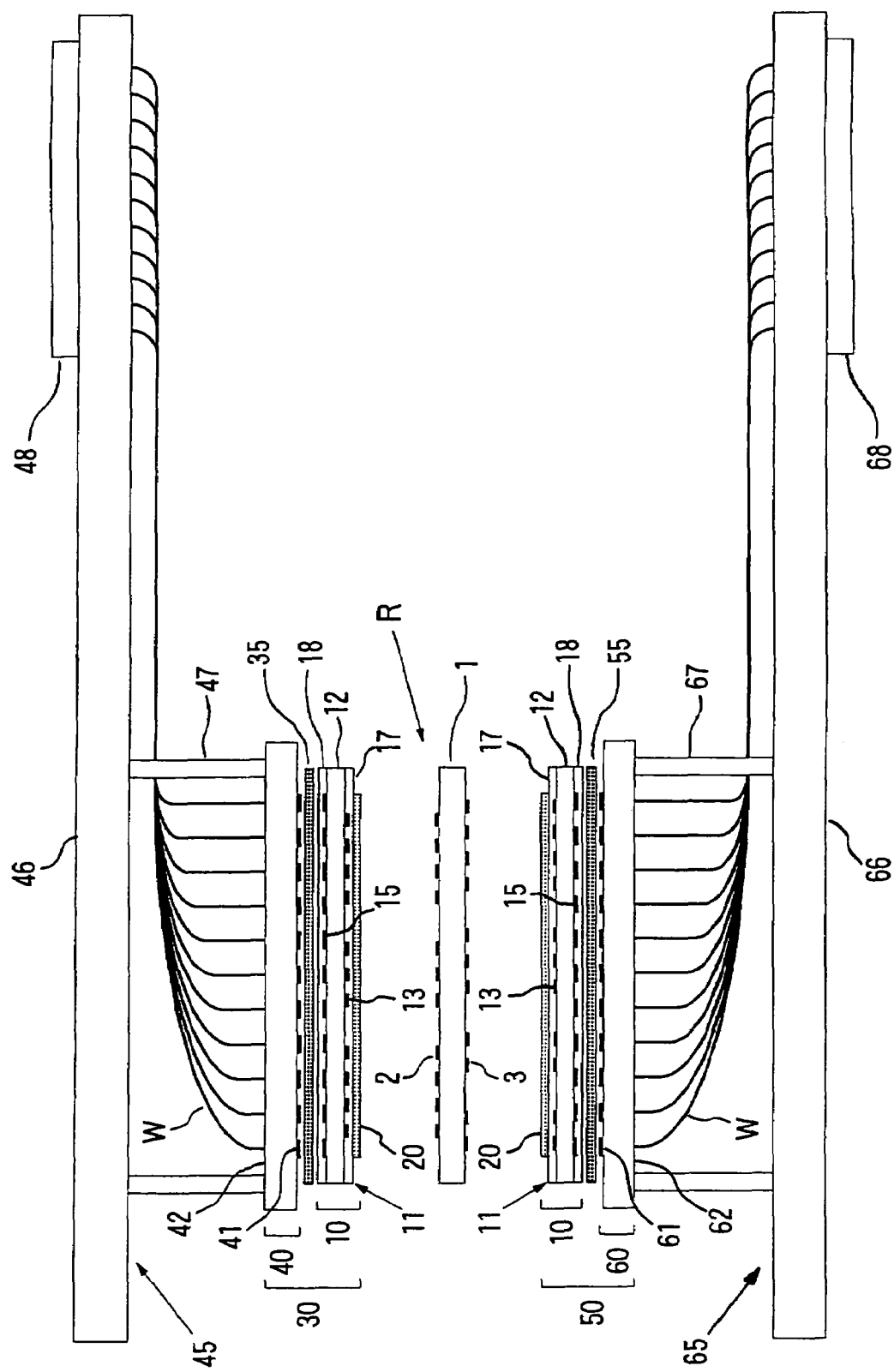
[FIG. 19] illustrates the construction of an inspection apparatus for circuit boards according to the first embodiment of the present invention.

FIG. 19 illustrates the construction of an inspection apparatus for circuit boards according to the first embodiment of the present invention. This inspection apparatus for circuit boards serves to conduct, for example, an open short-circuit test on a circuit board 1 to be inspected, on both surfaces of which electrodes 2 and 3 to be inspected have been formed respectively.

In this inspection apparatus for circuit board, an upper-side jig 30 for inspection is provided above an inspection-executing region R in which the circuit board 1 to be inspected is horizontally arranged, and an upper-side supporting mechanism 45 supporting the upper-side jig 30 for inspection is provided above the upper-side jig 30 for inspection. On the other hand, a lower-side jig 50 for inspection is provided below the inspection-executing region R, and a lower-side supporting mechanism 65 supporting the lower-side jig 50 for inspection is provided below the lower-side jig 50 for inspection.

The upper-side supporting mechanism 45 is constructed by a rectangular plate-like base table 46 and a plurality supporting pins 47 each extending downward from a surface (lower surface in FIG. 19) of this base table 46, and the upper-side jig 30 for inspection is supported on the tips of the respective supporting pins 47. Further, a connector 48 connected to a tester (not illustrated) is provided on the base table 46.

The lower-side supporting mechanism 65 is constructed by a rectangular plate-like base table 66 and a plurality supporting pins 67 each extending upward from a surface (upper surface in FIG. 19) of this base table 66, and the lower-side jig 50 for inspection is supported on the tips of the respective supporting pins 67. Further, a connector 68 connected to a tester (not illustrated) is provided on the base table 66.

The upper-side jig 30 for inspection is constructed by arranging the adaptor 10 (hereinafter also referred to as "adaptor" merely) for inspection of circuit boards of the construction shown in FIG. 1 through an anisotropically conductive elastomer sheet 35 on a front surface (lower surface in FIG. 19) of an inspection electrode device 40. The connecting electrodes 13 in the wiring board 11 for connection of this adaptor 10 are arranged in accordance with a pattern corresponding to a pattern of the electrodes (hereinafter also referred to as "one surface-side electrodes to be inspected") 2 to be inspected on one surface side in the circuit board 1 to be inspected. Incidentally, in FIG. 19, the connecting electrodes 13 and terminal electrodes 15 are illustrated seeing through the insulating layers 17 and 18.

The inspection electrode device 40 is constructed by a great number of pin-like inspection electrodes 41 each composed of a metal and an inspection electrode-supporting plate 42 for vertically supporting these inspection electrodes 41, and the inspection electrodes 41 are arranged in accordance with positions of lattice points having a pitch of, for example, 2.54 mm, 1.8 mm, 1.27 mm, 1.06 mm, 0.8 mm, 0.75 mm, 0.5 mm, 0.45 mm, 0.3 mm or 0.2 mm. Each of the inspection electrodes 41 is electrically connected to the connector 48 provided on the base table 46 of the upper-side supporting mechanism 45 through electric wires W provided at a proximal end (upper end in FIG. 19) thereof.

No particular limitation is imposed on the anisotropically conductive elastomer sheet 35 so far as necessary electrical connection between the terminal electrodes 15 of the wiring board 11 for connection in the adaptor 10 and the inspection electrodes 41 of the inspection electrode device 40 is achieved, and a conventionally known dispersion type anisotropically conductive elastomer sheet or uneven distribution type anisotropically conductive elastomer sheet may be used. The thickness of the anisotropically conductive elastomer sheet 35 is preferably 50 to 500 μm, more preferably 100 to 300 μm.

The lower-side jig 50 for inspection is constructed by arranging the adaptor 10 of the construction shown in FIG. 1 through an anisotropically conductive elastomer sheet 55 on a front surface (upper surface in FIG. 19) of an inspection electrode device 60. The connecting electrodes 13 in the wiring board 11 for connection of this adaptor 10 are arranged in accordance with a pattern corresponding to a pattern of the electrodes (hereinafter also referred to as "the other surface-side electrodes to be inspected") 3 to be inspected on the other surface side in the circuit board 1 to be inspected. Incidentally, in FIG. 19, the connecting electrodes 13 and terminal electrodes 15 are illustrated seeing through the insulating layers 17 and 18.

The inspection electrode device 60 is constructed by a great number of pin-like inspection electrodes 61 each composed of a metal and an inspection electrode-supporting plate 62 for vertically supporting these inspection electrodes 61, and the inspection electrodes 61 are arranged in accordance with positions of lattice points having a pitch of, for example, 2.54 mm, 1.8 mm, 1.27 mm, 1.06 mm, 0.8 mm, 0.75 mm, 0.5 mm, 0.45 mm, 0.3 mm or 0.2 mm. Each of the inspection electrodes 61 is electrically connected to the connector 68 provided on the base table 66 of the lower-side supporting mechanism 65 through electric wires W provided at a proximal end (lower end in FIG. 19) thereof.

No particular limitation is imposed on the anisotropically conductive elastomer sheet 55 so far as necessary electrical connection between the terminal electrodes 15 of the wiring board 11 for connection in the adaptor 10 and the inspection electrodes 61 of the inspection electrode device 60 is achieved, and a conventionally known dispersion type anisotropically conductive elastomer sheet or uneven distribution type anisotropically conductive elastomer sheet may be used. The thickness of the anisotropically conductive elastomer sheet 55 is preferably 50 to 500 μm, more preferably 100 to 300 μm.

In such an inspection apparatus for circuit board, electrical inspection of the circuit board 1 to be inspected is performed in the following manner.

The circuit board 1 to be inspected is first arranged in alignment with the inspection-executing region R by a proper conveying mechanism (not illustrated). More specifically, the circuit board 1 to be inspected is arranged in such a manner that one surface-side electrodes 2 to be inspected thereof are located just under respective positions of the connecting electrodes 13 of the wiring board 11 for connection in the upper-side jig 30 for inspection, and the other surface-side electrodes 3 to be inspected thereof are located just over respective positions of the connecting electrodes 13 of the wiring board 11 for connection in the lower-side jig 50 for inspection. In this embodiment, as the conveying mechanism, may preferably be used a conveying mechanism of the rail-conveying type having a conveyor belt and a guide rail.

For example, the lower-side supporting mechanism 65 is then moved upward to move the lower-side jig 50 for inspection in a direction (upward in FIG. 19) approaching the upper-side jig 30 for inspection, thereby bringing each of the adaptor 10 of the upper-side jig 30 for inspection and the adaptor 10 of the lower-side jig 50 for inspection into contact under pressure with the circuit board 1 to be inspected. As a result, in the upper-side jig 30 for inspection, the anisotropically conductive elastomer sheet 20 in the adaptor 10 is in a state pinched by the circuit board 1 to be inspected and the wiring board 11 for connection, whereby the connecting electrodes 13 of the wiring board 11 for connection are electrically connected to the respective one surface-side electrodes 2 to be inspected of the circuit board 1 to be inspected. The anisotropically conductive elastomer sheet 35 is also in a state pinched by the wiring board 11 for connection and the inspection electrode device 40, whereby the inspection electrodes 41 of the inspection electrode device 40 are electrically connected to the respective terminal electrodes 15 of the wiring board 11 for connection. On the other hand, in the lower-side jig 50 for inspection, the anisotropically conductive elastomer sheet 20 in the adaptor 10 is in a state pinched by the circuit board 1 to be inspected and the wiring board 11 for connection, whereby the connecting electrodes 13 of the wiring board 11 for connection are electrically connected to the respective other surface-side electrodes 3 to be inspected of the circuit board 1 to be inspected. The anisotropically conductive elastomer sheet 55 is also in a state pinched by the wiring board 11 for connection and the inspection electrode device 60, whereby the inspection electrodes 61 of the inspection electrode device 60 are electrically connected to the respective terminal electrodes 15 of the wiring board 11 for connection.

In such a manner, each of the one surface-side electrodes 2 to be inspected of the circuit board 1 to be inspected is electrically connected to the tester through the adaptor 10 in the upper-side jig 30 for inspection, the anisotropically conductive elastomer sheet 35 and the inspection electrode device 40, and each of the other surface-side electrodes 3 to be inspected of the circuit board 1 to be inspected is electrically connected to the tester through the adaptor 10 in the lower-side jig 50 for inspection, the anisotropically conductive elastomer sheet 55 and the inspection electrode device 60. This state is an inspectable state.

In this inspectable state, necessary electrical inspection on the circuit board 1 to be inspected is carried out. After completion of the electrical inspection on this circuit board 1 to be inspected, for example, the lower-side supporting mechanism 65 is moved downward to move the lower-side jig 50 for inspection in a direction (downward in FIG. 19) separating from the upper-side jig 30 for inspection, thereby releasing the inspectable state, the circuit board 1 to be inspected is conveyed from the inspection-executing region R to a proper place by the conveying mechanism, another circuit board to be inspected is conveyed to the inspection-executing region R, and the above-described operation is repeated on said circuit board to be inspected, thereby carrying out the electrical inspection.

According to such an inspection apparatus for circuit boards, an inspection operation can be smoothly carried out even when electrical inspection is continuously conducted on a great number of circuit boards 1 to be inspected, the anisotropically conductive elastomer sheet 20 in the adaptor 10 can be easily replaced by a new one when the anisotropically conductive elastomer sheet 20 suffers from trouble, and the original service life of the anisotropically conductive elastomer sheet 20 can be attained.

Figure 20:
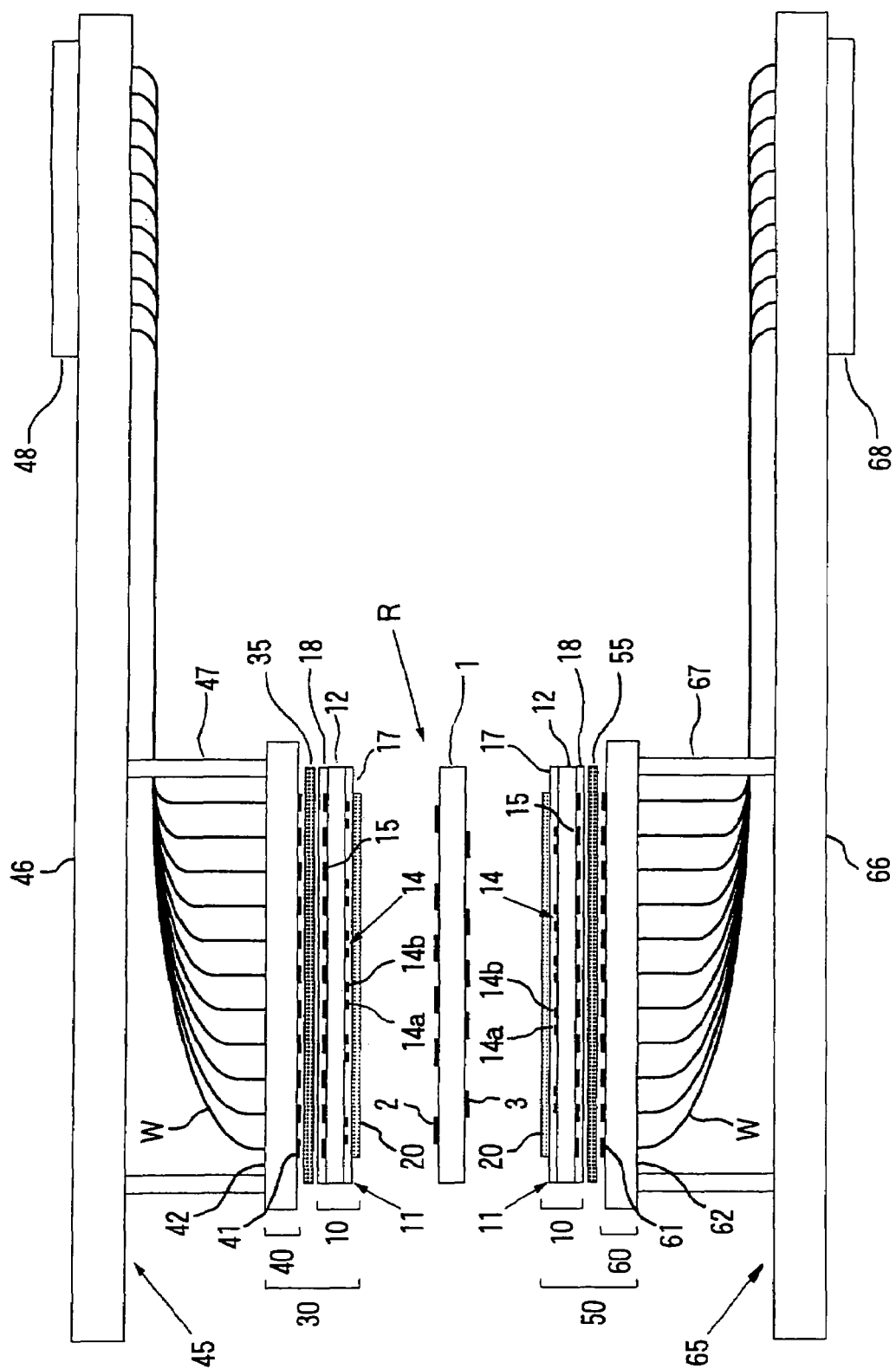
[FIG. 20] illustrates the construction of an inspection apparatus for circuit boards according to the second embodiment of the present invention.

FIG. 20 illustrates the construction of an inspection apparatus for circuit boards according to the second embodiment of the present invention. This inspection apparatus for circuit boards serves to conduct an electric resistance-measuring test on each wiring pattern as to a circuit board 1 to be inspected, on both surfaces of which electrodes 2 and 3 to be inspected have been formed respectively.

In this inspection apparatus for circuit board, an upper-side jig 30 for inspection is provided above an inspection-executing region R in which the circuit board 1 to be inspected is horizontally arranged, and an upper-side supporting mechanism 45 supporting the upper-side jig 30 for inspection is provided above the upper-side jig 30 for inspection. On the other hand, a lower-side jig 50 for inspection is provided below the inspection-executing region R, and a lower-side supporting mechanism 65 supporting the lower-side jig 50 for inspection is provided below the lower-side jig 50 for inspection. The upper-side supporting mechanism 45 and lower-side supporting mechanism 65 are basically of the same construction as the upper-side supporting mechanism 45 and lower-side supporting mechanism 65 in the inspection apparatus for circuit boards according to the first embodiment.

The upper-side jig 30 for inspection is constructed by arranging the adaptor 10 of the construction shown in FIG. 17 through an anisotropically conductive elastomer sheet 35 on a front surface (lower surface in FIG. 20) of an inspection electrode device 40. Pairs 14 of connecting electrodes in the wiring board 11 for connection of this adaptor 10 are arranged in accordance with a pattern corresponding to a pattern of the one surface-side electrodes 2 to be inspected in the circuit board 1 to be inspected. Incidentally, in FIG. 20, connecting electrodes 14a for current supply and connecting electrodes 14b for voltage measurement of the pairs 14 of connecting electrodes and terminal electrodes 15 are illustrated seeing through the insulating layers 17 and 18. The inspection electrode device 40 and anisotropically conductive elastomer sheet 35 are basically of the same construction as the inspection electrode device 40 and anisotropically conductive elastomer sheet 35 in the upper-side jig 30 for inspection of the inspection apparatus for circuit boards according to the first embodiment.

The lower-side jig 50 for inspection is constructed by arranging the adaptor 10 of the construction shown in FIG. 17 through an anisotropically conductive elastomer sheet 55 on a front surface (upper surface in FIG. 20) of an inspection electrode device 60. Pairs 14 of connecting electrodes in the wiring board 11 for connection of this adaptor 10 are arranged in accordance with a pattern corresponding to a pattern of the other surface-side electrodes 3 to be inspected in the circuit board 1 to be inspected. Incidentally, in FIG. 20, connecting electrodes 14a for current supply and connecting electrodes 14b for voltage measurement of the pairs 14 of connecting electrodes and terminal electrodes 15 are illustrated seeing through the insulating layers 17 and 18. The inspection electrode device 60 and anisotropically conductive elastomer sheet 55 are basically of the same construction as the inspection electrode device 60 and anisotropically conductive elastomer sheet 55 in the lower-side jig 50 for inspection of the inspection apparatus for circuit boards according to the first embodiment.

In such an inspection apparatus for circuit board, electrical inspection of the circuit board 1 to be inspected is performed in the following manner.

The circuit board 1 to be inspected is first arranged in alignment with the inspection-executing region R by a proper conveying mechanism (not illustrated). More specifically, the circuit board 1 to be inspected is arranged in such a manner that the one surface-side electrodes 2 to be inspected thereof are located just under respective positions of the pairs 14 of connecting electrodes of the wiring board 11 for connection in the upper-side jig 30 for inspection, and the other surface-side electrodes 3 to be inspected thereof are located just over respective positions of the pairs 14 of connecting electrodes of the wiring board 11 for connection in the lower-side jig 50 for inspection. In this embodiment, as the conveying mechanism, may preferably be used a conveying mechanism of the rail-conveying type having a conveyor belt and a guide rail.

For example, the lower-side supporting mechanism 65 is then moved upward to move the lower-side jig 50 for inspection in a direction (upward in FIG. 20) approaching the upper-side jig 30 for inspection, thereby bringing each of the adaptor 10 of the upper-side jig 30 for inspection and the adaptor 10 of the lower-side jig 50 for inspection into contact under pressure with the circuit board 1 to be inspected. As a result, in the upper-side jig 30 for inspection, the anisotropically conductive elastomer sheet 20 in the adaptor 10 is in a state pinched by the circuit board 1 to be inspected and the wiring board 11 for connection, whereby each of the one surface-side electrodes 2 to be inspected of the circuit board 1 to be inspected is electrically connected to both of the connecting electrode 14a for current supply and connecting electrode 14b for voltage measurement in each of the pairs 14 of connecting electrodes of the wiring board 11 for connection. The anisotropically conductive elastomer sheet 35 is also in a state pinched by the wiring board 11 for connection and the inspection electrode device 40, whereby the terminal electrodes 15 of the wiring board 11 for connection are electrically connected to the respective inspection electrodes 41 of the inspection electrode device 40. On the other hand, in the lower-side jig 50 for inspection, the anisotropically conductive elastomer sheet 20 in the adaptor 10 is in a state pinched by the circuit board 1 to be inspected and the wiring board 11 for connection, whereby each of the other surface-side electrodes 3 to be inspected of the circuit board 1 to be inspected is electrically connected to both of the connecting electrode 14a for current supply and connecting electrode 14b for voltage measurement in each of the pairs 14 of connecting electrodes of the wiring board 11 for connection. The anisotropically conductive elastomer sheet 55 is also in a state pinched by the wiring board 11 for connection and the inspection electrode device 60, whereby the terminal electrodes 15 of the wiring board 11 for connection are electrically connected to the respective inspection electrodes 61 of the inspection electrode device 60.

In such a manner, each of the one surface-side electrodes 2 to be inspected of the circuit board 1 to be inspected is electrically connected to the tester through the adaptor 10 in the upper-side jig 30 for inspection, the anisotropically conductive elastomer sheet 35 and the inspection electrode device 40, and each of the other surface-side electrodes 3 to be inspected of the circuit board 1 to be inspected is electrically connected to the tester through the adaptor 10 in the lower-side jig 50 for inspection, the anisotropically conductive elastomer sheet 55 and the inspection electrode device 60. This state is an inspectable state.

In this inspectable state, necessary electrical inspection on the circuit board 1 to be inspected is carried out. More specifically, a current of a fixed value is supplied between the connecting electrodes 14a for current supply of the wiring board 11 for connection in the adaptor 10 of the upper-side jig 30 for inspection and the connecting electrodes 14a for current supply of the wiring board 11 for connection in the adaptor 10 of the lower-side jig 50 for inspection, and one among a plurality of the connecting electrodes 14b for voltage measurement of the wiring board 11 for connection in the adaptor 10 of the upper-side jig 30 for inspection is designated to measure a voltage between the designated one connecting electrode 14b for voltage measurement and a connecting electrode 14b for voltage measurement of the wiring board 11 for connection in the adaptor 10 of the lower-side jig 50 for inspection, which has been electrically connected to the other surface-side electrode 3 to be inspected corresponding to the one surface-side electrode 2 to be inspected, which has been electrically connected to the designated connecting electrode 14b for voltage measurement, thereby obtaining an electric resistance value of a wiring pattern formed between said one surface-side electrode 2 to be inspected, which has been electrically connected to the designated one connecting electrode 14b for voltage measurement, and the other surface-side electrode 3 to be inspected corresponding to this electrode 2 on the basis of the thus-obtained voltage value. The designated connecting electrode 14b for voltage measurement is successively changed, thereby conducting measurement of electric resistances of wiring patterns respectively formed between all of the one surface-side electrodes 2 to be inspected and their corresponding other surface-side electrodes 3 to be inspected.

After the electrical inspection on this circuit board 1 to be inspected has been completed in such a manner, for example, the lower-side supporting mechanism 65 is moved downward to move the lower-side jig 50 for inspection in a direction (downward in FIG. 20) separating from the upper-side jig 30 for inspection, thereby releasing the inspectable state, the circuit board 1 to be inspected is conveyed from the inspection-executing region R to a proper place by the conveying mechanism, another circuit board to be inspected is conveyed to the inspection-executing region R, and the above-described operation is repeated on said another circuit board to be inspected, thereby carrying out the electrical inspection.

According to such an inspection apparatus for circuit boards, an inspection operation can be smoothly carried out even when electrical inspection is continuously conducted on a great number of circuit boards 1 to be inspected, the anisotropically conductive elastomer sheet 20 in the adaptor 10 can be easily replaced by a new one when the anisotropically conductive elastomer sheet 20 suffers from trouble, and the original service life of the anisotropically conductive elastomer sheet 20 can be attained.

The present invention is not limited to the above-described embodiments, and various modifications can be added thereto.

For example, the anisotropically conductive elastomer sheet 20 in the adaptor 10 for inspection of circuit boards is not limited to such a dispersion type anisotropically conductive elastomer sheet as shown in FIG. 1, and it may be an uneven distribution type anisotropically conductive elastomer sheet obtained by forming a great number of conductive path-forming parts each extending in a thickness-wise direction thereof, in which conductive particles P are densely filled, and an insulating part mutually insulating these conductive path-forming parts, in which the conductive particles P do not exist at all or scarcely exist.

Various kinds of construction may be adopted in the inspection apparatus for circuit boards so far as they have the adaptor for inspection of circuit boards according to the present invention.

Figure 21:
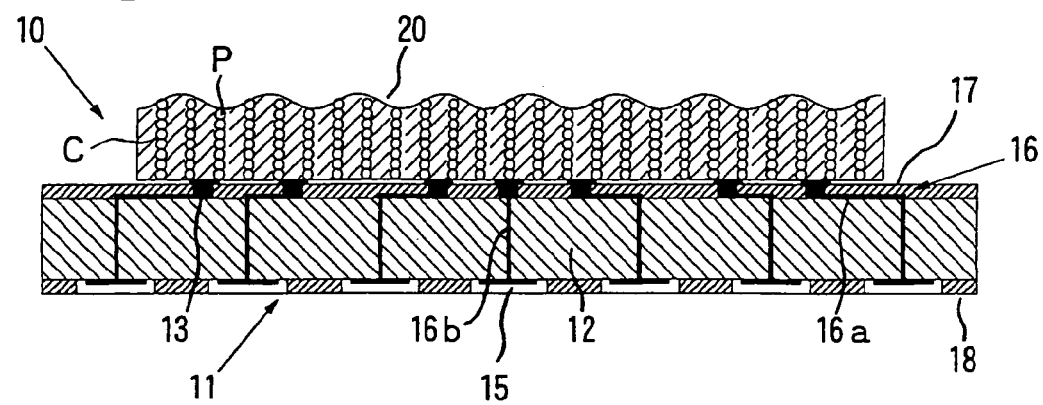
[FIG. 21] is a cross-sectional view illustrating the construction of an adaptor for inspection of circuit boards according to a further embodiment of the present invention.

The connecting electrodes 13 in the wiring board 11 for connection may also be formed so as to protrude from the front surface of the insulating layer 17 as shown in FIG. 21.

In such construction, the projected height of the connecting electrode 13 from the insulating layer 17 is preferably at most 100 µm, more preferably at most 70 µm. If this projected height is too great, such connecting electrodes 13 obstruct, and so the adhesion of the anisotropically conductive elastomer sheet 20 to the wiring board 11 for connection becomes insufficient, so that it is difficult to prevent the anisotropically conductive elastomer sheet 20 from separating from the wiring board 11 for connection, such connecting electrodes 13 are easy to be damaged when the anisotropically conductive elastomer sheet is used repeatedly, and so it is difficult to attain a long service life.

Such a wiring board 11 for connection can be produced in the following manner.

A laminated material obtained by laminating thin metal layers 13A and 15A on both surfaces of a flat plate-like insulating substrate 12 is first provided as shown in FIG. 3. In this laminated material, a plurality of through-holes 16H each extending through in a thickness-wise direction of the laminated material are formed in accordance with a pattern corresponding to a pattern of terminal electrodes 15 to be formed as shown in FIG. 4. The interiors of the through-holes 16H formed in the laminated material are then subjected to an electroless plating treatment and an electroplating treatment, thereby forming via holes 16b connected to the thin metal layers 13A and 15A as shown in FIG. 5.

Figure 22:
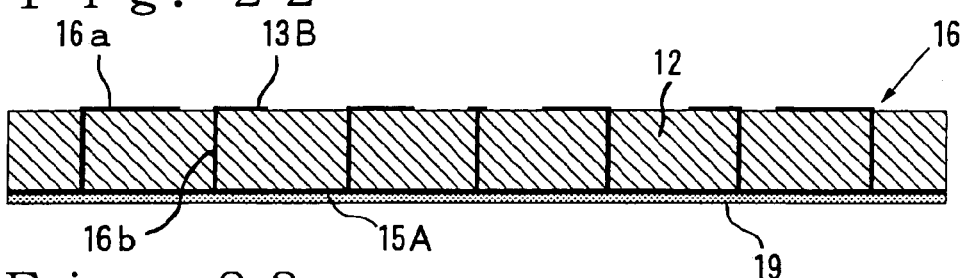
[FIG. 22] is a cross-sectional view illustrating a state that base layers for connecting electrodes and patterned wiring parts have been formed on a front surface of an insulating substrate in a production process of a wiring board for connection in the adaptor shown in FIG. 21 for inspection of circuit boards.
Figure 23:
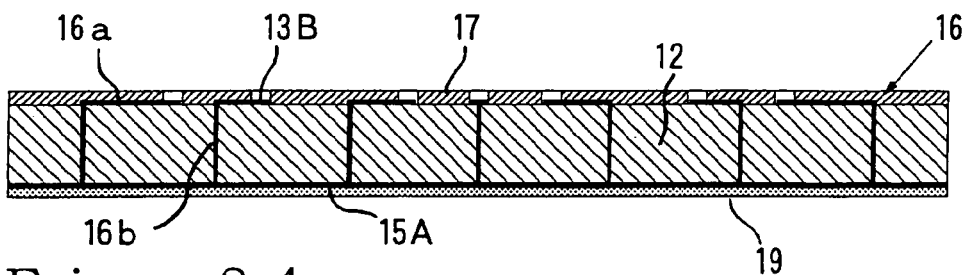
[FIG. 23] is a cross-sectional view illustrating a state that an insulating layer has been formed on the front surface of the insulating substrate.
Figure 24:
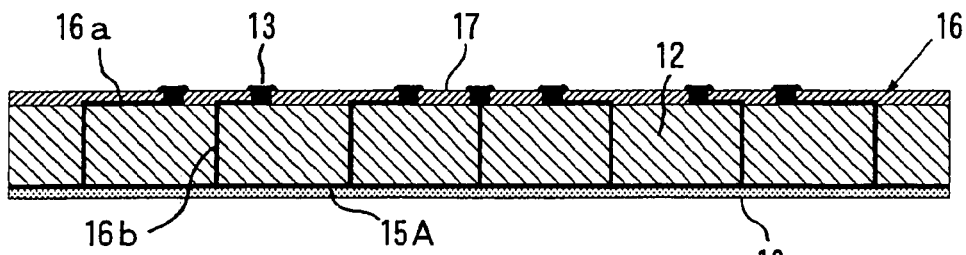
[FIG. 24] is a cross-sectional view illustrating a state that connecting electrodes projecting from the surface of the insulating layer have been formed.

The thin metal layer 13A formed on the front surface of the insulating substrate 12 is then subjected to a photo-etching treatment, thereby forming a plurality of base layers 13B for connecting electrodes on the front surface of the insulating substrate 12 and patterned wiring parts 16a for electrically connecting the base layers 13B for connecting electrodes to the via holes 16b as shown in FIG. 22. Before the photo-etching treatment is conducted, a protecting seal 19 is arranged in advance so as to cover the thin metal layer 15A formed on the back surface of the insulating substrate 12. Thereafter, as shown in FIG. 23, an insulating layer 17 is formed on the front surface of the insulating substrate 12 in such a manner that the respective base layers 13B for connecting electrodes are exposed. The respective base layers 13B for connecting electrodes are then subjected to an electroplating treatment by using the thin metal layer 15A formed on the bask surface of the insulating substrate 12 as a common electrode, thereby forming connecting electrodes 13 protruding from a surface of the insulating layer 17 as shown in FIG. 24.

Figure 25:
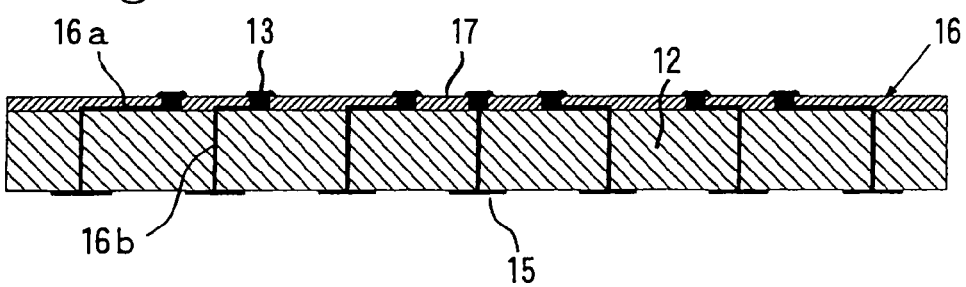
[FIG. 25] is a cross-sectional view illustrating a state that terminal electrodes have been formed on a back surface of the insulating substrate.
Figure 26:
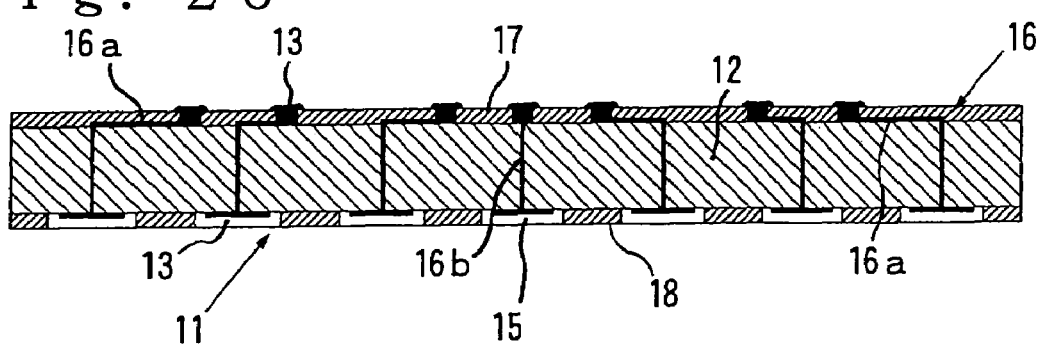
[FIG. 26] is a cross-sectional view illustrating a state that an insulating layer has been formed on the back surface of the insulating substrate.

After the protecting seal 19 is then removed from the thin metal layer 15A, the thin metal layer 15A is subjected to a photo-etching treatment, thereby forming a plurality of terminal electrodes 15 electrically connected to the respective via holes 16b on the back surface of the insulating substrate 12 as shown in FIG. 25. As shown in FIG. 26, an insulating layer 18 is formed on the back surface of the insulating substrate 12 in such a manner that the respective terminal electrodes 15 are exposed, thereby obtaining the wiring board 11 for connection.

EXAMPLES

The present invention will hereinafter be described specifically by the following examples. However, the present invention is not limited to these examples.

In the following Example and Comparative Example, the value of surface roughness is indicated as a value obtained by measuring a center-line average surface roughness Ra under conditions of a cutoff value of 0.8 mm and a measurement length of 0.25 mm in accordance with JIS B 0601 using a three-dimensional surface structure analyzing microscope "New View 200" manufactured by Zygo Co.

[Circuit Board for Evaluation]

A circuit board for evaluation of the following specification was provided.

Dimensions: 100 mm (length)×100 mm (breadth)×0.8 mm (thickness); Number of upper surface-side electrodes to be inspected: 7,312;

Diameter of upper surface-side electrodes to be inspected: 0.3 mm;

Minimum pitch of upper surface-side electrodes to be inspected: 0.4 mm;

Number of lower surface-side electrodes to be inspected: 3,784;

Diameter of lower surface-side electrodes to be inspected: 0.3 mm;

Minimum pitch of lower surface-side electrodes to be inspected: 0.4 mm.

Example 1

An inspection apparatus for circuit boards for inspecting the above-described circuit board for evaluation, which was adapted to an inspection section of a rail-conveying type automatic circuit board inspection machine (manufactured by NIDEC-READ CORPORATION, trade name: STAR-REC V5), was produced in accordance with the construction shown in FIG. 19 and FIG. 21 in the following manner.

[Adaptor (10) for Inspection of Circuit Boards]

(1) Anisotropically Conductive Elastomer Sheet (20):

Solution A and Solution B of addition type liquid silicone rubber of a two-pack type were mixed in proportions that their amounts become equal. After 100 parts by weight of conductive particles having an average particle diameter of 20 μm were added to and mixed with 100 parts by weight of this mixture, the resultant mixture was subjected to a defoaming treatment by pressure reduction, thereby preparing a molding material.

In the above-described process, as the addition type silicone rubber, was used silicon rubber, in which both Solution A and Solution B had a viscosity of 500 P, and a cured product thereof had a compression set of 6% at 150° C. (by a measuring method in accordance with JIS K 6249) and tear strength of 25 kN/m at 23° C. (by a measuring method in accordance with JIS K 6249).

Also, those (average coating amount: 5% by weight of the weight of core particles) obtained by using nickel particles as core particles and subjecting the core particles to electroless plating with gold were used as the conductive particles.

After a frame-like spacer having a rectangular opening of 120 mm×200 mm and a thickness of 0.08 mm was then arranged on a molding surface of the other surface-side molding member, the molding material prepared was applied to within the opening of the spacer, and one surface-side molding member was arranged on this molding material in such a manner that the molding surface thereof comes into contact with the molding material.

In the above-described process, a non-glossy surface (surface roughness: 1 μm) of a polyester resin sheet (product of Toray Industries, Inc.; trade name "Mat Lumirror S10") having a thickness of 0.1 mm was used as the molding surface of one surface-side molding member, and a glossy surface (surface roughness: 0.04 μm) of a polyester resin sheet (product of Toray Industries, Inc.; trade name "Mat Lumirror S10") having a thickness of 0.1 mm was used as the molding surface of the other surface-side molding member.

Thereafter, a pressure roll device composed of a pressure roll and a supporting roll was used to pinch the molding material by the one surface-side molding member and the other surface-side molding member, thereby forming a molding material layer having thickness of 0.08 mm between said one surface-side molding member and the other surface-side molding member.

Electromagnets were then arranged on respective back surfaces of the one surface-side molding member and the other surface-side molding member to subject the molding material layer to a curing treatment under conditions of 120° C. for 30 minutes while applying a parallel magnetic field of 0.3 T to the molding material layer in its thickness-wise direction, thereby producing a rectangular anisotropically conductive elastomer sheet having a thickness of 0.1 mm.

The thus-obtained anisotropically conductive elastomer sheet had a surface roughness of 1.4 μm on one surface thereof and a surface roughness of 0.12 μm on the other surface thereof and contained the conductive particles in a proportion of 12% in terms of a volume fraction. This anisotropically conductive elastomer sheet is referred to as "anisotropically conductive elastomer sheet (a)".

(2) Wiring Board (11) for Connection:

In a laminated material (product of Matsushita Electric Works Ltd., trade name: R-1766) obtained by forming thin metal layers each composed of copper and having a thickness of 18 μm on both surfaces of an insulating substrate composed of a glass fiber-reinforced epoxy resin, were formed 7,312 circular through-holes in total each extending through in a thickness-wise direction of the laminated material and having a diameter of 0.2 mm by a numerically controlled drilling apparatus. Thereafter, the laminated material, in which the through-holes had been formed, was subjected to an electroless plating treatment using an EDTA type copper plating solution, thereby forming a copper plated layer on each internal wall of the through-holes, and further subjected to a copper electroplating treatment using a copper sulfate plating solution, thereby forming a cylindrical via hole having a wall thickness of about 10 μm and electrically connecting both thin metal layers in the laminated material to each other within each of the through-holes.

A dry film resist (product of Tokyo Ohka Kogyo Co., Ltd., trade name: FP-225) was then laminated on the thin metal layer on one surface side in the laminated material to form a resist layer, and moreover a protecting seal was arranged on the thin metal layer on the other surface side in the laminated material. Thereafter, a photo-mask film was arranged on this resist layer, the resist layer was subjected to an exposing treatment using a parallel ray exposure system (manufactured by ORC Manufacturing Co., Ltd.), a developing treatment was then conducted, thereby forming a resist pattern for etching on the thin metal layer on one surface side in the laminated material. The thin metal layer on one surface side in the laminated material was subjected to an etching treatment, thereby forming, on the front surface of the insulating substrate, 7,312 base layers for connecting electrodes, which were arranged in accordance with a pattern corresponding to a pattern of the electrodes to be inspected on the upper surface side of the circuit board for evaluation and each had a diameter of 200 μm, and patterned wiring parts electrically connecting each of the base layers for connecting electrodes to the via hole and having a line width of 100 μm. Thereafter, the resist pattern was removed.

A dry film solder resist (product of Hitachi Chemical Co., Ltd., trade name: SR-2300G) having a thickness of 25 μm was then laminated on the front surface of the insulating substrate, on which the base layers for connecting electrodes and the patterned wiring parts had been formed, to form an insulating layer. A photo-mask film was arranged on this insulating layer, the insulating layer was subjected to an exposing treatment using a parallel ray exposure system (manufactured by ORC Manufacturing Co., Ltd.), a developing treatment was then conducted, thereby forming 7,312 openings each having a diameter of 200 μm, through which the respective base layers for connecting electrodes were exposed. Each of the base layers for connecting electrodes was subjected to a copper electroplating treatment with a copper sulfate plating solution by using the thin metal layer on the other surface side in the laminated material as a common electrode, thereby forming 7,312 connecting electrodes each protruding from the surface of the insulating layer.

The protecting seal formed on the thin metal layer on the other surface side in the laminated material was then removed, and a dry film resist (product of Tokyo Ohka Kogyo Co., Ltd., trade name: FP-225) having a thickness of 25 μm was laminated on the thin metal layer on the other surface side to form a resist layer. Thereafter, a photo-mask film was arranged on this resist layer, the resist layer was subjected to an exposing treatment using a parallel ray exposure system (manufactured by ORC Manufacturing Co., Ltd.), and a developing treatment was then conducted, thereby forming a resist pattern for etching on the thin metal layer on the other surface side in the laminated material. The thin metal layer on the other surface side in the laminated material was subjected to an etching treatment, thereby forming, on the back surface of the insulating substrate, 7,312 terminal electrodes arranged in accordance with positions of lattice points, and patterned wiring parts electrically connecting each of the terminal electrodes to the via hole. Thereafter, the resist pattern was removed.

A dry film solder resist (product of Nichigo-Morton Co., Ltd., trade name: Conformask 2015) having a thickness of 38 μm was then laminated on the back surface of the insulating substrate, on which the terminal electrodes and the patterned wiring parts had been formed, to form an insulating layer. A photo-mask film was arranged on this insulating layer, the insulating layer was subjected to an exposing treatment using a parallel ray exposure system (manufactured by ORC Manufacturing Co., Ltd.), a developing treatment was then conducted, thereby forming 7,312 openings each having a diameter of 0.4 mm, through which the respective terminal electrodes were exposed.

The wiring board for connection for the upper-side jig for inspection was produced in the above-described manner. This wiring board for connection is such that the dimensions are 120 mm in length, 160 mm in breadth and 0.5 mm in thickness, the diameter of a portion exposed to the surface of the insulating layer in each of the connecting electrodes is about 300 μm, the projected height from the surface of the insulating layer in the connecting electrodes is about 25 μm, the minimum arrangement pitch between the connecting electrodes is 0.4 mm, the diameter of the terminal electrodes is 0.4 mm, the arrangement pitch between the terminal electrodes is 0.45 mm, and the surface roughness of the insulating layer on the side of the front surface (surface on which the connecting electrodes were formed) is 0.02 μm.

The above-described anisotropically conductive elastomer sheet (a) was arranged on the front surface of this wiring board for connection, thereby constructing the adaptor (hereinafter also referred to as "upper-side adaptor") for inspection of circuit boards on the upper side.

A wiring board for connection for the lower-side jig for inspection, which had 3,784 connecting electrodes on its front surface and 3,784 terminal electrodes on its back surface, was produced in the same manner as described above. This wiring board for connection is such that the dimensions are 120 mm in length, 160 mm in breadth and 0.5 mm in thickness, the diameter of a portion exposed to the surface of the insulating layer in each of the connecting electrodes is about 300 μm, the projected height from the surface of the insulating layer in the connecting electrodes is about 25 μm, the minimum arrangement pitch between the connecting electrodes is 0.4 mm, the diameter of the terminal electrodes is 0.4 mm, the arrangement pitch between the terminal electrodes is 0.45 mm, and the surface roughness of the insulating layer on the side of the front surface (surface on which the connecting electrodes were formed) is 0.02 μm.

The above-described anisotropically conductive elastomer sheet (a) was arranged on the front surface of this wiring board for connection, thereby constructing the adaptor (hereinafter also referred to as "lower-side adaptor") for inspection of circuit boards on the lower side.

[Anisotropically Conductive Elastomer Sheets (35, 55)]

An uneven distribution type anisotropically conductive elastomer sheet of the following specification was used as an anisotropically conductive elastomer sheet arranged between the adaptor for inspection of circuit boards and the inspection electrode device.

This uneven distribution type anisotropically conductive elastomer sheet is such that it is formed by silicone rubber having a hardness of 30, the dimensions are 110 mm in length and 110 in breadth, the thickness of the conductive path-forming parts is 0.6 mm, the outer diameter of the conductive path-forming parts is 0.25 mm, and the projected height from the insulating part in the conductive path-forming parts is 0.05 mm. Conductive particles are contained in the conductive path-forming parts in a proportion of 13% by volume. The conductive particles are obtained by plating the surfaces of nickel particles with gold and have an average particle diameter of 35 μm.

[Inspection Electrode Devices (40, 60)]

An upper-side inspection electrode device and a lower-side inspection electrode device of the following respective specifications were produced.

The upper-side inspection electrode device has an inspection electrode-supporting plate composed of a glass fiber-reinforced epoxy resin (product of Nikko Kasei Co., Ltd., trade name: NIKOLYTE) and having dimensions of 200 mm in length, 346 mm in breadth and 10 mm in thickness and 7,312 inspection electrodes each having a diameter of 0.35 mm. These inspection electrodes are arranged in accordance with positions of lattice points of a pitch of 0.45 mm and supported by the inspection electrode-supporting plate. Each of the inspection electrodes is electrically connected to a connector provided on the base table in an upper-side supporting mechanism, which will be described subsequently, through an electrical wire.

The lower-side inspection electrode device has an inspection electrode-supporting plate composed of a glass fiber-reinforced epoxy resin (product of Nikko Kasei Co., Ltd., trade name: NIKOLYTE) and having dimensions of 200 mm in length, 346 mm in breadth and 10 mm in thickness and 3,784 inspection electrodes each having a diameter of 0.35 mm. These inspection electrodes are arranged in accordance with positions of lattice points of a pitch of 0.45 mm and supported by the inspection electrode-supporting plate. Each of the inspection electrodes is electrically connected to a connector provided on the base table in a lower-side supporting mechanism, which will be described subsequently, through an electrical wire.

[Upper-side Supporting Mechanism (45) and Lower-side Supporting Mechanism (65)]

The upper-side supporting mechanism is constructed by a base table composed of a laminated plate (product of Sumitomo Bakelite Co., Ltd., trade name: SUMILITE) of a phenol resin containing a fine thread cloth and having a thickness of 10 mm, and 10 supporting pins each having an outer diameter of 10 mm and an overall length of 67 mm.

The lower-side supporting mechanism is constructed by a base table composed of a laminated plate (product of Sumitomo Bakelite Co., Ltd., trade name: SUMILITE) of a phenol resin containing a fine thread cloth and having a thickness of 10 mm, and 10 supporting pins each having an outer diameter of 10 mm and an overall length of 67 mm.

[Performance Evaluation]

The inspection apparatus for circuit boards was installed in the inspection section of the rail-conveying type automatic circuit board inspection machine "STARREC V5" (manufactured by NIDEC-READ CORPORATION) to conduct a test of connection stability and a test of separating tendency of the anisotropically conductive elastomer sheet in the adaptor for inspection of circuit boards in accordance with the following respective methods.

(1) Test of Connection Stability:

The inspection apparatus for circuit boards was installed in the rail-conveying type automatic circuit board inspection machine "STARREC V5" (manufactured by NIDEC-READ CORPORATION), and the circuit board for evaluation was set in the inspection region of the inspection apparatus for circuit boards. A pressurizing operation was then conducted against the circuit board for evaluation under a prescribed press load. In this state, a current of 1 mA was applied between the connecting electrodes of the wiring board for connection in the upper-side adaptor and the connecting electrodes of the wiring board for connection in the lower-side adaptor to measure an electric resistance value as to the circuit board for evaluation, and the pressurization against the circuit board for evaluation was then released. This operation for measuring the electric resistance value was conducted 10 times in total. An inspection point (hereinafter also referred to as "NG inspection point") at which the electric resistance value measured reached 100Ω or higher was judged to be defective conduction to calculate out a proportion (hereinafter also referred to as "proportion of NG inspection points") of the number of the NG inspection points to the total number of inspection points (total number of upper-side electrodes to be inspected of the circuit board for evaluation). The step of determining such a proportion of NG inspection points was conducted by changing the press load stepwise within a range of 100 to 250 kgf, thereby determining a minimum press load under which the proportion of NG inspection points was lower than 0.01%.

In an inspection apparatus for circuit boards, it is necessary from the viewpoint of practical use that the proportion of NG inspection points is lower than 0.01%. If the proportion of NG inspection points is 0.01% or higher, there is a possibility that a nondefective circuit board to be inspected may be judged to be a defective. It is hence difficult to conduct electrical inspection as to circuit boards with high reliability.

The minimum press load determined in such a manner is referred to as "connectable load". The smaller connectable load value indicates that the connection stability is higher.

Since the electrical inspection of a circuit board to be inspected can be conducted under smaller pressurizing force as the connectable load is smaller, deterioration of the circuit board to be inspected and constructional members such as the anisotropically conductive elastomer sheets and wiring boards for connection by pressurizing force upon inspection can be inhibited, and moreover parts low in durable strength upon pressurization may be used as the constructional members of the inspection apparatus, and so the miniaturization of the inspection apparatus and the simplification of the structure become feasible. As a result, there are advantages that the durability of the inspection apparatus itself can be improved, and production cost of the inspection apparatus can be reduced.

The results are shown in Table 1.

(2) Test of Separating Tendency:

The inspection apparatus for circuit boards was installed in the inspection region of the rail-conveying type automatic circuit board inspection machine "STARREC V5", and the circuit board for evaluation was conveyed in the inspection region of the inspection apparatus for circuit boards by the rail-conveying type automatic circuit board inspection machine "STARREC V5". A pressurizing operation was then conducted against the circuit board for evaluation under conditions of a press load of 150 kgf. In this state, a current of 1 mA was applied between the connecting electrodes of the wiring board for connection in the upper-side adaptor and the connecting electrodes of the wiring board for connection in the lower-side adaptor to measure an electric resistance value as to the circuit board for evaluation, and the pressurization against the circuit board for evaluation was then released. This operation for measuring the electric resistance value was conducted 10 times in total. Thereafter, the circuit board for evaluation was conveyed out of the inspection region of the inspection apparatus for circuit boards. This process was conducted on 100 circuit boards for evaluation to determine the number of times (hereinafter referred to as "the number of conveyance errors") where the anisotropically conductive elastomer sheet (a) separated from the wiring board for connection and adhered to the circuit board for evaluation when the circuit board for evaluation was conveyed out of the inspection region of the inspection apparatus for circuit boards. The results are shown in Table 1

Comparative Example 1

In the inspection apparatus for circuit boards produced in Example 1, the following anisotropically conductive elastomer sheet (b) was used in place of the anisotropically conductive elastomer sheet (a) to construct an inspection apparatus for circuit boards, and the test of connection stability and the test of separating tendency were conducted on this inspection apparatus in the same manner as in Example 1. The results are shown in Table 1.

Anisotropically Conductive Elastomer Sheet (b):

After a frame-like spacer having a rectangular opening of 120 mm×200 mm and a thickness of 0.08 mm was arranged on a molding surface of the other surface-side molding member, a molding material prepared in the same manner as in Example 1 was applied to within the opening of the spacer, and one surface-side molding member was arranged on this molding material in such a manner that the molding surface thereof comes into contact with the molding material.

In the above-described process, polyester resin sheets (products of Toray Industries, Inc.; trade name "Mat Lumirror S10") having a thickness of 0.1 mm were used as the one surface-side molding member and the other surface-side molding member with the glossy surfaces (surface roughness: 0.04 μm) thereof used as the molding surfaces.

Thereafter, a pressure roll device composed of a pressure roll and a supporting roll was used to pinch the molding material by the one surface-side molding member and the other surface-side molding member, thereby forming a molding material layer having thickness of 0.08 mm between said one surface-side molding member and the other surface-side molding member.

Electromagnets were then arranged on respective back surfaces of the one surface-side molding member and the other surface-side molding member to subject the molding material layer to a curing treatment under conditions of 120° C. for 30 minutes while applying a parallel magnetic field of 0.3 T to the molding material layer in its thickness-wise direction, thereby producing a rectangular anisotropically conductive elastomer sheet having a thickness of 0.1 mm.

The thus-obtained anisotropically conductive elastomer sheet had a surface roughness of 0.13 μm on one surface thereof and a surface roughness of 0.12 μm on the other surface thereof and contained the conductive particles in a proportion of 12% in terms of a volume fraction. This anisotropically conductive elastomer sheet is referred to as "anisotropically conductive elastomer sheet (b)".

TABLE 1

| | Proportion of NG inspection points (%) Press load (kgf) | | | | | | Connectable load | Number of conveyance |
|---|---|---|---|---|---|---|---|---|
| | 100 | 110 | 130 | 150 | 180 | 200 | (kgf) | errors (time) |
| Example 1 | 1.6 | 0.3 | 0.01 | 0 | 0 | 0 | 150 | 0 |
| Comparative Example 1 | 1.5 | 0.4 | 0.02 | 0 | 0 | 0 | 150 | 92 |

The invention claimed is:

1. An adaptor for inspection of circuit boards, comprising:
a wiring board for connection, on a front surface of which a plurality of connecting electrodes are formed in accordance with a pattern corresponding to a pattern of electrodes to be inspected of a circuit board, which is an object of inspection; and
an anisotropically conductive elastomer sheet detachably arranged on the front surface of the wiring board for connection, wherein
the anisotropically conductive elastomer sheet has a surface roughness of 0.5 to 5 µm on its front surface coming into contact with the circuit board, and a surface roughness of at most 0.3 µm on its back surface coming into contact with the wiring board for connection, and wherein
the wiring board for connection includes, on its front surface, an insulating layer formed such that each of the connecting electrodes is exposed, and the insulating layer has a surface roughness of at most 0.2 µm on its front surface.

2. An adaptor for inspection of circuit boards, comprising:
a wiring board for connection, on a front surface of which plural pairs of connecting electrodes each composed of a connecting electrode for current supply and a connecting electrode for voltage measurement are formed in accordance with a pattern corresponding to a pattern of electrodes to be inspected of a circuit board, which is an object of inspection; and
an anisotropically conductive elastomer sheet detachably arranged on the front surface of the wiring board for connection, wherein
the anisotropically conductive elastomer sheet has a surface roughness of 0.5 to 5 µm on its front surface coming into contact with the circuit board, and a surface roughness of at most 0.3 µm on its back surface coming into contact with the wiring board for connection, and wherein
the wiring board for connection includes, on its front surface, an insulating layer formed such that each pair of the connecting electrodes are exposed, and the insulating layer has a surface roughness of at most 0.2 µm on its front surface.

3. The adaptor according to claim 2 for inspection of circuit boards, wherein the anisotropically conductive elastomer sheet is obtained by containing a number of conductive particles exhibiting magnetism in an elastic polymeric substance, and the conductive particles are oriented so as to align in a thickness-wise direction of the sheet, thereby forming a plurality of chains of the conductive particles.

4. The adaptor according to claim 3 for inspection of circuit boards, wherein the anisotropically conductive elastomer sheet is such that chains of the conductive particles are formed in a state distributed in a plane direction.

5. An inspection apparatus for circuit boards, comprising the adaptor according to claim 4 for inspection of circuit boards.

6. An inspection apparatus for circuit boards, comprising the adaptor according to claim 3 for inspection of circuit boards.

7. An inspection apparatus for circuit boards, comprising the adaptor according to claim 2 for inspection of circuit boards.

8. The adaptor according to claim 1 for inspection of circuit boards, wherein the anisotropically conductive elastomer sheet is obtained by containing a number of conductive particles exhibiting magnetism in an elastic polymeric substance, and the conductive particles are oriented so as to align in a thickness-wise direction of the sheet, thereby forming a plurality of chains of the conductive particles.

9. The adaptor according to claim 8 for inspection of circuit boards, wherein the anisotropically conductive elastomer sheet is such that chains of the conductive particles are formed in a state distributed in a plane direction.

10. An inspection apparatus for circuit boards, comprising the adaptor according to claim 9 for inspection of circuit boards.

11. An inspection apparatus for circuit boards, comprising the adaptor according to claim 8 for inspection of circuit boards.

12. An inspection apparatus for circuit boards, comprising the adaptor according to claim 1 for inspection of circuit boards.

* * * * *